US009836165B2

(12) United States Patent
Nho et al.

(10) Patent No.: US 9,836,165 B2
(45) Date of Patent: Dec. 5, 2017

(54) INTEGRATED SILICON-OLED DISPLAY AND TOUCH SENSOR PANEL

(71) Applicant: Apple Inc., Cupertino, CA (US)

(72) Inventors: Hyunwoo Henry Nho, Stanford, CA (US); Hopil Bae, Sunnyvale, CA (US); Weijun Yao, San Jose, CA (US); Yingxuan Li, Saratoga, CA (US); Ahmad Al-Dahle, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/280,355

(22) Filed: May 16, 2014

(65) Prior Publication Data
US 2015/0331508 A1 Nov. 19, 2015

(51) Int. Cl.
| G06F 3/044 | (2006.01) |
| G06F 3/042 | (2006.01) |
| G06F 3/041 | (2006.01) |
| H01L 27/32 | (2006.01) |
| G06K 9/00  | (2006.01) |

(52) U.S. Cl.
CPC ............ *G06F 3/0421* (2013.01); *G06F 3/042* (2013.01); *G06F 3/044* (2013.01); *G06F 3/0412* (2013.01); *G06K 9/0002* (2013.01); *H01L 27/323* (2013.01); *G06F 2203/04103* (2013.01); *G06F 2203/04106* (2013.01)

(58) Field of Classification Search
CPC ............ G06F 3/041–3/047; G06F 2203/04106
See application file for complete search history.

(56) References Cited

U.S. PATENT DOCUMENTS 5,483,261 A  1/1996  Yasutake
5,488,204 A  1/1996  Mead et al.
(Continued)

FOREIGN PATENT DOCUMENTS

JP  2000-163031 A  6/2000
JP  2002-342033 A  11/2002

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.
(Continued)

*Primary Examiner* — Gene W Lee
(74) *Attorney, Agent, or Firm* — Morrison & Foerster LLP

(57) ABSTRACT

An integrated Silicon-OLED display and touch sensor panel is disclosed. The integrated Silicon-OLED display and touch sensor panel can include a Silicon substrate, an array of transistors, one or more metallization layers, one or more vias, an OLED stack, color filters, touch sensors, and additional components and circuitry. Additional components and circuitry can include an electrostatic discharge device, a light shielding, a switching matrix, one or more photodiodes, a near-infrared detector and near-infrared color filters. The integrated Silicon-OLED display and touch sensor panel can be further configured for near-field imaging, optically-assisted touch, and fingerprint detection. In some examples, a plurality of touch sensors and/or display pixels can be grouped into clusters, and the clusters can be coupled to a switching matrix for dynamic change of touch and/or display granularity.

25 Claims, 29 Drawing Sheets

(56) References Cited

U.S. PATENT DOCUMENTS

| | | | |
|---|---|---|---|
| 5,825,352 | A | 10/1998 | Bisset et al. |
| 5,835,079 | A | 11/1998 | Shieh |
| 5,880,411 | A | 3/1999 | Gillespie et al. |
| 6,188,391 | B1 | 2/2001 | Seely et al. |
| 6,310,610 | B1 | 10/2001 | Beaton et al. |
| 6,323,846 | B1 | 11/2001 | Westerman et al. |
| 6,690,387 | B2 | 2/2004 | Zimmerman et al. |
| 7,015,894 | B2 | 3/2006 | Morohoshi |
| 7,184,064 | B2 | 2/2007 | Zimmerman et al. |
| 7,663,607 | B2 | 2/2010 | Hotelling et al. |
| 8,479,122 | B2 | 7/2013 | Hotelling et al. |
| 8,624,849 | B2 | 1/2014 | Chang et al. |
| 2004/0252867 | A1* | 12/2004 | Lan et al. ............... 382/124 |
| 2006/0169608 | A1* | 8/2006 | Carnevali ......... G06F 1/1626 206/320 |
| 2006/0197753 | A1 | 9/2006 | Hotelling |
| 2008/0112677 | A1* | 5/2008 | Smith ............... H04N 9/3141 385/119 |
| 2008/0121442 | A1* | 5/2008 | Boer et al. ............... 178/18.09 |
| 2010/0265206 | A1* | 10/2010 | Chen ........................ 345/174 |
| 2010/0283756 | A1* | 11/2010 | Ku et al. .................... 345/174 |
| 2011/0187668 | A1 | 8/2011 | Hente |
| 2012/0113050 | A1 | 5/2012 | Wang et al. |
| 2013/0057495 | A1* | 3/2013 | Wang ................... G06F 3/044 345/173 |
| 2013/0088425 | A1* | 4/2013 | Yun .................... G06F 3/0425 345/156 |
| 2013/0147727 | A1 | 6/2013 | Lee et al. |
| 2013/0147730 | A1* | 6/2013 | Chien et al. ............... 345/173 |
| 2013/0265276 | A1* | 10/2013 | Obeidat et al. ............ 345/174 |
| 2013/0306946 | A1 | 11/2013 | Chang et al. |
| 2014/0110683 | A1* | 4/2014 | Huang et al. ................ 257/40 |
| 2014/0118419 | A1* | 5/2014 | Wu et al. .................... 345/690 |
| 2014/0145976 | A1* | 5/2014 | Tang .................... G06F 3/0412 345/173 |
| 2014/0346493 | A1* | 11/2014 | Lee .................... G06F 3/0412 257/40 |
| 2014/0362306 | A1* | 12/2014 | Chen .................... G06F 1/1656 349/12 |
| 2015/0015517 | A1* | 1/2015 | Zhao .................... G06F 3/048 345/173 |
| 2015/0070301 | A1* | 3/2015 | Chia .................... G06F 3/041 345/174 |
| 2015/0091849 | A1* | 4/2015 | Ludden ............... G06F 3/0412 345/174 |

OTHER PUBLICATIONS

Rubine, D.H. (Dec. 1991). "The Automatic Recognition of Gestures," CMU-CS-91-202, Submitted in Partial Fulfillment of the Requirements of the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

\* cited by examiner

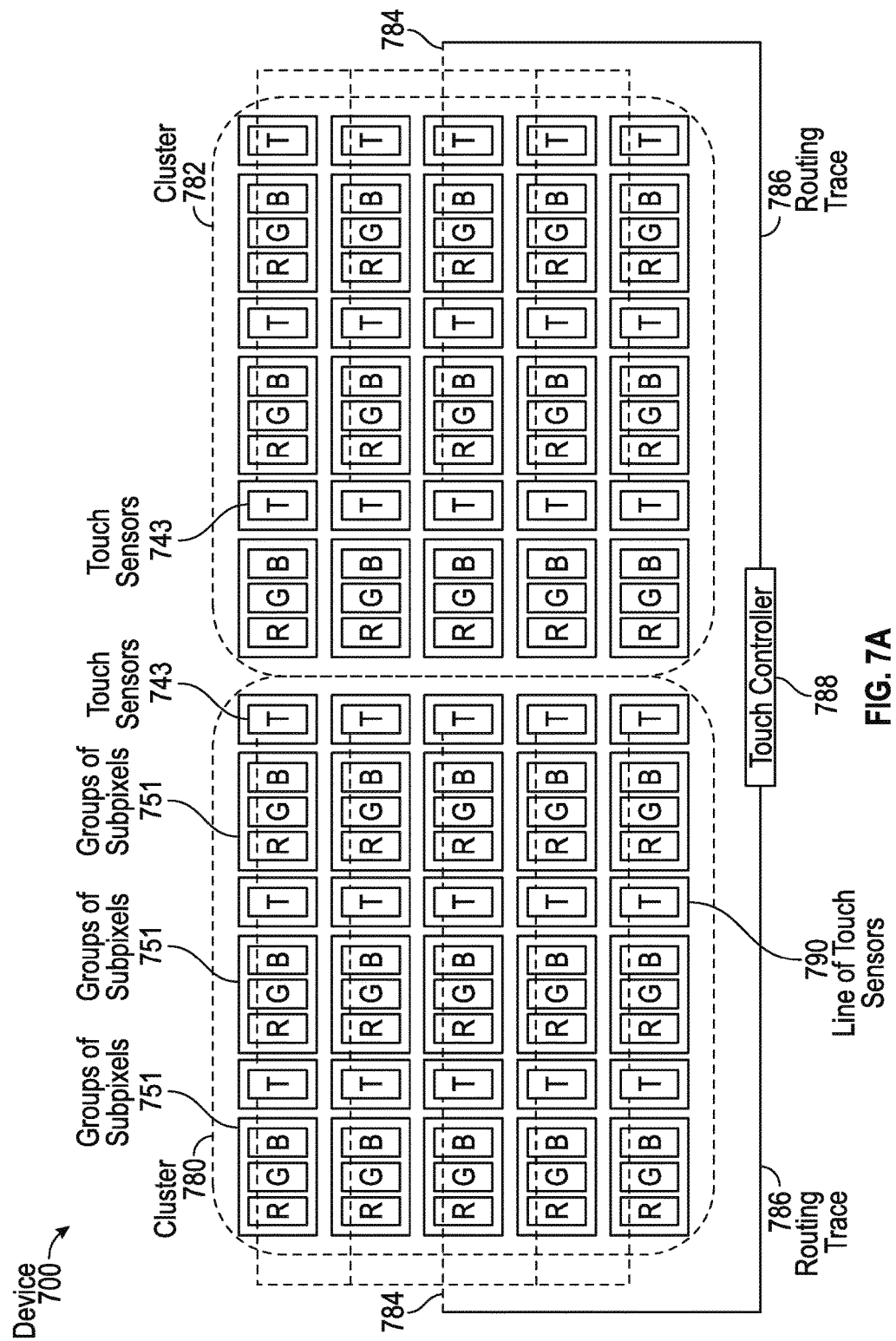

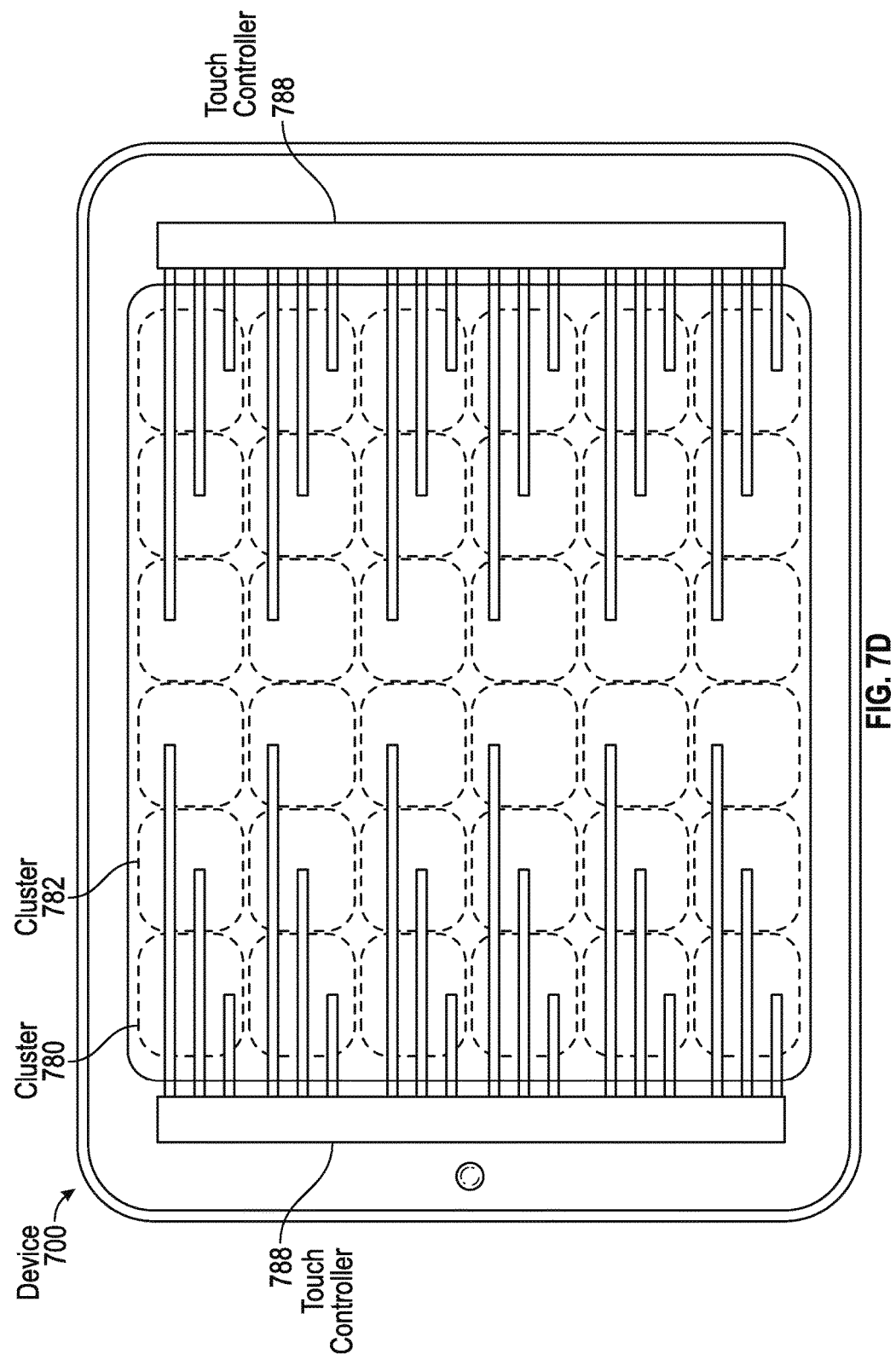

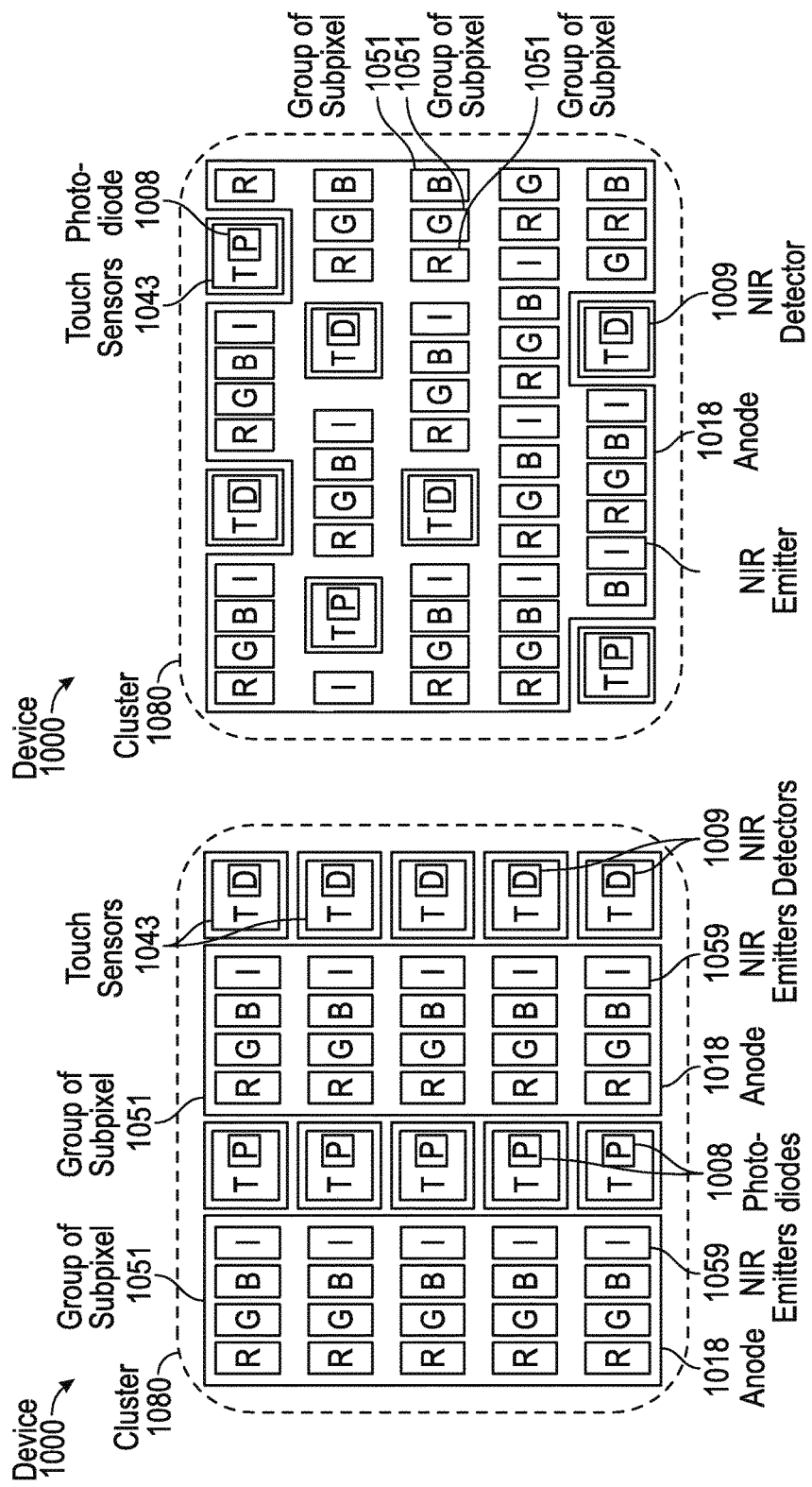

INTEGRATED SILICON-OLED DISPLAY AND TOUCH SENSOR PANEL

FIELD OF THE DISCLOSURE

This relates generally to a display and touch sensor panel and, more particularly, to an integrated Silicon-OLED display and touch sensor panel.

BACKGROUND OF THE DISCLOSURE

Many types of input devices are presently available for performing operations in a computing system, such as buttons or keys, mice, trackballs, joysticks, touch sensor panels, touch screens and the like. Touch screens, in particular, are becoming increasingly popular because of their ease and versatility of operation as well as their declining price. Touch screens can include a touch sensor panel, which can be a clear panel with a touch-sensitive surface, and a display device positioned partially or fully behind the panel so that the touch-sensitive surface can cover at least a portion of the viewable area of the display device. The display device can include technologies such as liquid crystal displays (LCDs), organic light emitting diode (OLED) displays, etc. OLEDs, for example, can provide a flat or flexible display in a relatively thin package that can be suitable for use in a variety of portable electronic devices. In addition, OLED displays can display brighter and more vibrant images in a thinner and lighter package compared to LCD displays, making them suitable for use in compact portable electronic devices.

Advantages of OLED displays over other types of displays make integrating OLED displays into portable electronic devices attractive. Integrating the OLED display and touch screen into a single device can include fabricating the OLED stack on a glass or plastic substrate, forming the touch sensors on the OLED stack, and electrically coupling the touch sensors and transistors for the OLED stack using routing traces and one or more metallization layers. Alternatively, the OLED stack and the touch screen can be fabricated separately and then adhered together using a conductive paste. However, both techniques can include high temperature or high pressure processes that can damage the OLED stack. Furthermore, stacking the touch sensors and any routing circuitry for the touch sensors on the OLED stack can lead to portable electronic devices with unacceptable thicknesses. Additionally, formation of the OLED stack on a glass or plastic substrate can lead to poor manufacturing yields, high process variations, and poor transistor/wiring performance.

SUMMARY OF THE DISCLOSURE

This relates to integrated Silicon-OLED display and touch sensor panel stackup configurations that can be used in portable electronic devices such as media players, mobile telephones, and tablet computing devices. Stackup configurations can include a Silicon substrate, an array of transistors, one or more metallization layers, one or more vias, an OLED stack, color filters, touch sensors, and additional components and circuitry. Forming the OLED stack and touch sensors on a Silicon substrate can allow for an extremely high number of pixels per inch. With a high number of pixels per inch, the OLED subpixels can be arranged side-by-side with the touch sensors leading to portable electronic devices that are thinner and lighter. Arranging the OLED subpixels side-by-side with the touch sensors can also lead to a wider viewing angle display with a higher contrast ratio, higher brightness, and more vibrant colors without compromising touch sensitivity.

Due to the higher number of pixels per inch, the stackup configurations can also include one or more additional components such as electrostatic discharge devices, switches, near-field imagers, near-infrared emitters, and near-infrared detectors. The additional components can improve the functionality of the device by consuming less power, enhancing touch sensitivity, and enhancing fingerprint detection capabilities. In some examples, the integrated Silicon-OLED display and touch sensor panel can be coupled with one or more fiber optic magnifiers to achieve a portable electronic device with extended touch and display capability.

BRIEF DESCRIPTION OF THE DRAWINGS

FIG. 7A illustrates a close-up top view of subpixels and touch sensors grouped into clusters in an exemplary integrated Silicon-OLED display and touch sensor panel according to examples of the disclosure.

FIG. 7D illustrates a plan view of an exemplary integrated Silicon-OLED display and touch sensor panel including a plurality of clusters coupled together according to examples of the disclosure.

FIGS. 10D-10E illustrate top views of exemplary integrated Silicon-OLED display and touch sensor panels including near-field imaging photodiodes and near-infrared detectors according to examples of the disclosure.

DETAILED DESCRIPTION

Figure 1A:
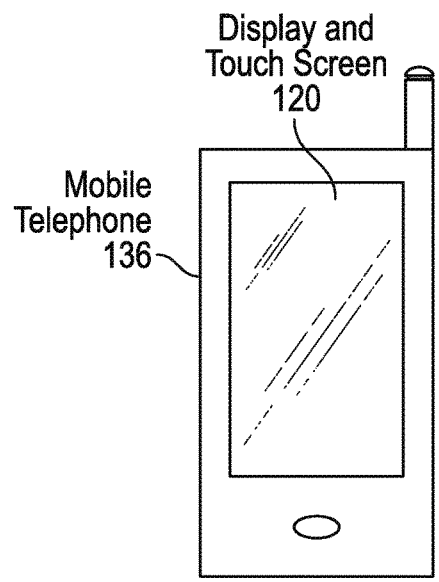
FIGS. 1A-1C illustrate systems in which examples of the disclosure can be implemented.

In the following description of examples, reference is made to the accompanying drawings which form a part hereof, and in which it is shown by way of illustration specific examples that can be practiced. It is to be understood that other examples can be used and structural changes can be made without departing from the scope of the disclosed examples.

Various techniques and process flow steps will be described in detail with reference to examples as illustrated in the accompanying drawings. In the following description, numerous specific details are set forth in order to provide a thorough understanding of one or more aspects and/or features described or referenced herein. It will be apparent, however, to one skilled in the art, that one or more aspects and/or features described or referenced herein may be practiced without some or all of these specific details. In other instances, well-known process steps and/or structures have not been described in detail in order to not obscure some of the aspects and/or features described or referenced herein.

Further, although process steps or method steps can be described in a sequential order, such processes and methods can be configured to work in any suitable order. In other words, any sequence or order of steps that can be described in the disclosure does not, in and of itself, indicate a requirement that the steps be performed in that order. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modification thereto, does not imply that the illustrated process or any of its steps are necessary to one or more of the examples, and does not imply that the illustrated process is preferred.

This disclosure relates generally to an integrated Silicon-OLED display and touch sensor panel. Touch sensors and associated touch circuitry can be combined with an OLED display and associated display circuitry to form an integrated Silicon-OLED display and touch sensor panel. Existing schemes to combine a touch panel with a display can involve forming the touch sensors on top of the display or mounting a transparent touch panel on top of a display. In some examples, some layers of the touch panel can also serve as layers of the display and some of the touch sensor circuitry can be shared with some of the display circuitry. However, these systems can require multiple separate layers for the touch sensors, touch circuitry, display pixels, and display circuitry. This can result in relatively expensive and large, bulky systems. Furthermore, a brightness and quality of a displayed image can be decreased, as the touch related layers are usually not completely transparent.

Touch sensors and touch sensing circuitry can include, for example, touch signal lines, such as drive lines and sense lines, grounding regions, and other circuitry. One way to reduce the size of an integrated touch screen can be to include multi-function circuit elements that can form part of the display circuitry designed to operate as circuitry of the display system to generate an image on the display. The multi-function circuit elements can also form part of the touch sensing circuitry of a touch sensing system that can sense one or more touches on or near the display. The multi-function circuit elements can be, for example, capacitors in display pixels of an LCD that can be configured to operate as storage capacitors/electrodes, common electrodes, conductive wires/pathways, etc., of the display circuitry in the display system, and that can also be configured to operate as circuit elements of the touch sensing circuitry. In this way, for example, in a display with integrated touch sensing capability can be manufactured using fewer parts and/or processing steps, and the display itself can be thinner, brighter, and requires less power. However, as the compact portable electronic devices are becoming smaller and smaller, using multi-function circuit elements may still not meet the size and weight demands, particularly for miniature portable electronic devices such as pendants and wearable devices. Additionally, the sharing of components or circuit elements for the touch sensor circuitry with the display circuitry can require time-multiplexing and hence, limited capability for simultaneous touch detection and display.

Examples of the disclosure are directed to adding multi-touch functionality to an OLED display without the need of a separate multi-touch panel or layer overlaying the OLED display. The OLED display, display circuitry, touch sensors, and touch circuitry can be formed on a Silicon substrate. By fabricating the integrated OLED display and touch sensor panel on a Silicon substrate, extremely high pixels per inch (PPI) can be achieved. For example, an OLED display formed on a glass or plastic substrate can achieve 300-500 PPI, whereas an OLED display formed on a Silicon substrate can achieve 3000 PPI. Due to the extremely high PPI, the pixels used to display an image can be formed next to the touch sensors instead of overlaying the display device behind the touch sensors, leading to thinner and more lightweight devices. Additionally, the semiconductor industry has already developed advanced processes for electronic components and circuitry on Silicon substrates. The maturity and existing capabilities of the advanced processes on Silicon substrates can lead to higher yields and cheaper manufacturing costs.

The display and touch functionality can be implemented on the same circuit, so they can be synchronized. Any noise resulting from the display functionality may not detrimentally affect the touch functionality and vice versa. The ability to dedicate separate components to the display pixels and separate components to the touch sensors can be more effective at reducing noise through the use of shielding components. Additionally, separate components for display and touch can lead to multi-functional capability, where the panel can display an image and sense a touch simultaneously or at a same time.

Figure 1B:
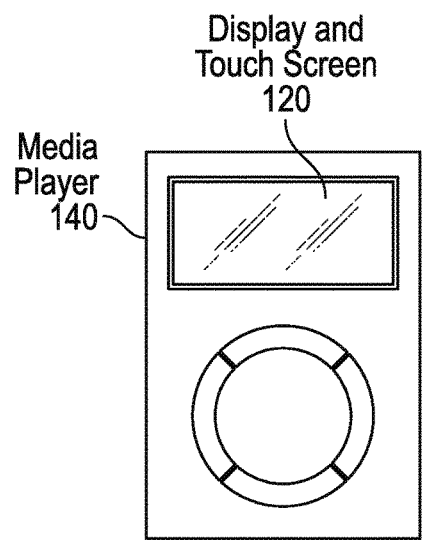
Figure 1C:
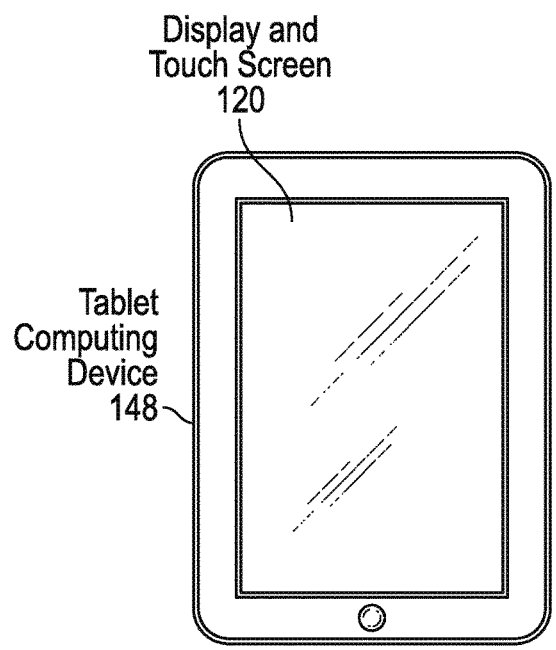

FIGS. 1A-1C illustrate systems in which examples of the disclosure can be implemented. FIG. 1A illustrates an exemplary mobile telephone 136 that can include a display and touch screen 120. FIG. 1B illustrates an exemplary media player 140 that can include a display and touch screen 120. FIG. 1C illustrates an exemplary tablet computing device 148 that can include a display and touch screen 120. The display and touch screens 120 in FIGS. 1A-1C can include one or more touch sensor panels with integrated Silicon-OLED displays according to examples of the disclosure.

The touch and display screen can include one or more touch sensors forming an array of touch sensors under a touch and display surface (e.g., cover glass or cover material). The detection of a touch event by one or more touch sensors can be sensed by sense circuitry and processed or otherwise interpreted. The array of touch sensors can have touch sensing locations and can form a touch sensitive surface. In some examples, the touch sensors are capacitive touch sensors. However, the claimed subject matter is not limited to capacitive touch sensing technology. Accordingly, many different configurations, touch sensing technologies, or various manufacturing processes can be employed without departure from or with respect to claimed subject matter scope. It is, therefore, understood that any or all configurations, technologies, or processes, or the like, are intended to fall within the scope of claimed subject matter. What is provided herein are simply illustrative examples thereof. For example, a touch sensor configuration can utilize, but is not limited to, touch sensing technologies that employ resistive, optical, surface acoustic, self-capacitance, mutual capacitance, or any combinations therefore, just to name a few.

The array of touch sensors having respective touch sensing locations can include one or more patterns of conductive traces (e.g., drive and sense lines) arranged in a manner so as to sense a change in capacitance which can be occasioned by an object, such as a finger or stylus, touching, contacting, or hovering over or on the touch surface. A touch sensitive surface can include an array of touch sensors at particular touch points or touch locations. For example, an array of touch sensor can be formed from a pattern of conductive traces. As an object approaches a touch sensitive surface, one or more touch sensors of the configuration at particular touch sensing points or locations can experience a change in capacitance or resistance from a proximity to an object. By detecting a change in capacitance or resistance at one or more touch sensing points or locations, and by noting the particular location or position associated with the change in capacitance or resistance, a sensing circuit can detect and register one or more touch events, such as, for example, an image of touch. After being detected and registered, touch events can be processed or otherwise used at least in part to control operation of an electronic device, such as for one or more operations of the mobile telephone 136, media player 140, and tablet computing device 148 of FIGS. 1A-1C, by way of example.

Although several different examples are possible, configurations or arrangements for use in touch sensor panels can include mutual-capacitance sensing, self-capacitance, and resistive sensing. In mutual capacitance sensing, capacitance between drive and sense lines can be measured. In a self-capacitance sensing, for example, capacitance can be measured relative to some reference, such as a ground or ground plane. In resistive sensing, a change in current when two electrodes or plates come into contact can be measured. Accordingly, mutual capacitance sensing, self-capacitance sensing, and resistive sensing can have similar common aspects with respect to structural or electrical arrangements employed.

In mutual capacitance sensing, for example, sensing locations can be formed by a crossing of patterned conductors formed from spatially separated conductive lines or traces. In some examples, conductive traces can lie in substantially parallel planes, the conductive traces of a particular plane being referred to as being substantially co-planar. Furthermore, substantially co-planar conductive traces can be oriented to be substantially parallel. However, conductive traces from different planes can be oriented so as to be substantially perpendicular in direction. That is, substantially co-planar conductive traces lying in a first plane having a first orientation or direction can be substantially perpendicular to substantially co-planar conductive traces lying in a second plane or in another plane having a second orientation or direction.

For example, in one example, drive lines can be formed on a first layer in a first direction and sensing lines can be formed on a second layer in a second direction substantially perpendicular to the first direction such that drive and sense lines can "cross" one another at various sensing locations, albeit the drive lines being on a different layer than the sense lines. It is noted herein that for purposes of this disclosure, the term "on" is not intended to necessarily refer to directly on. For example, a second layer can be formed on a first layer without the two layers being in direct physical contact. Thus, there can, continuing with the example, be additional layers or other materials between these first and second layers. Notwithstanding the examples provided above, it should be understood that other non-perpendicular (e.g., non-orthogonal) orientations of the traces in the two planes are also possible.

Multiple arrangements or configurations are also possible to provide capacitance sensing, although claimed subject matter is not intended to be limited to any particular one. For example, conductive traces can be formed on different sides of a substrate. Conductive traces, that can include shapes such as diamonds that cross in the manner discussed above, can also be formed on one side of a substrate with an insulating separation, such as a dielectric, separating the traces at crossover locations. Conductive traces can also be formed on different substrates with the substrates being oriented so that the conductive traces lie in different substantially parallel planes while being on different layers. Employing a separation between drive and sense lines can result in capacitive coupling or capacitively coupled nodes between sense lines and drive lines at common locations or crossing location that otherwise lie in different substantially parallel planes, as described above. In such examples, these capacitively coupled locations can form an array of touch sensors.

In some examples, the device can measure an applied touch force or pressure. The touch sensor panel can include a drive layer, a sense layer, and conductive paths on the drive layer and sense layer. The touch sensor panel can further include a deformable member such as a dielectric spring layer or raised structures that separate the drive layer and sense layer. As a user applies a pressure or touches the panel, the conductive paths on the drive layer and sense layer can be brought closer together and can compress the deformable member. Bringing the drive layer and sense layer closer together can cause a change in separation and a change in mutual capacitance between conductive paths on the drive layer and sense layer. The change in capacitance can be indicative of the amount, intensity, and/or strength of the force applied. Although the above examples describes force detection using a dielectric spring layer, deformable member, and raised structures, examples of the disclosure can include any number of different force detection mechanisms such as pressure-sensitive ink members and dedicated force sensors.

In another example, an array of touch sensors can be formed from conductive traces and shapes such as patches and columns formed on the same layer on the same side of a substrate in a single-sided ITO (SITO) configuration, for example. In a SITO configuration, the drive lines can be formed from a row of patches of conductive material that can be coupled through conductive traces and metal in the border areas of the panel. The sense lines can be formed as columns or connected patches of conductive material. Other SITO configurations are also possible. Therefore, claimed subject matter is not limited in scope to this particular description. In some SITO examples, electrical activation or stimulation of a drive line can result in mutual capacitance between adjacent drive and sense line patches or columns, for example. A finger or other object can result in a change in this mutual capacitance that can be detected by sensing circuits. In some examples, the array of touch sensors can be formed on different sides of a substrate or on different substrates such as in a double-sided ITO (DITO) configuration.

Self-capacitance sensing, in contrast, can measure capacitance relative to a reference ground plane. A self-capacitance example typically employs an array or other arrangement of conductive patches or pads, such as Indium Tin Oxide (ITO) pads or patches. It is noted, without limitation, that ground plane can be formed on the back side of a substrate, on the same side as an array of conductive pads or patches, but separated from the patches or pads, or on a separate substrate. We likewise note that claimed subject matter is not limited in scope to ITO. Rather, any transparent conductive material, such as, for example, Zinc Tin Oxide (ZTO), can likewise be employed or any combinations thereof. In a self-capacitance touch sensor, self-capacitance of a sensor relative to the reference ground can be changed due to at least in part to the presence of an object, such as a finger. In some self-capacitance examples, self-capacitance of conductive column traces, for example, can be sensed independently, and self-capacitance of conductive row traces can also be sensed independently.

Resistive sensing can detect a touch based on a change in measured current. A resistive touch sensor can employ a drive layer and a sense layer arranged so that the conductive paths on the drive layer overlap with the conductive paths of the sense layer, thereby forming capacitors whose plates (e.g., conductive paths) are separated by air. When a touch pad is touched, the conductive paths on the drive layer and sense layer come into contact causing a change in resistance (can be measured as a change in current) that can be used to identify where the touch event occurred.

As shall be explained in greater detail, an OLED stack can be employed to project one or more images. The arrangement, for example, can allow a user to make selections or move a cursor, such as touching a portion of a touch sensitive surface with an object (e.g., a finger), or by placing an object in close proximity to the surface. In general, a touch sensitive surface can recognize and electronically register a touch or other direct physical contact or a near-touch with the touch sensitive surface via the touch sensors coupled to processing components or circuitry within the portable electronic device capable of processing such actions, gestures or surface contacts. Therefore, a computing system including circuitry or processors, for example, can interpret the registered touches or near-touches and perform an action based at least in part on processing by the computing system. In some examples, the interpreted touch data can result in a processor or other circuit electrically activating pixels of the array to change the display.

OLEDs can provide potential advantages over possible alternative display technologies, such as LCD and LED displays. OLED displays can be thinner, lighter, and more flexible than other types of displays with faster response times (e.g., higher refresh rates). OLED displays do not require a back light since the light can be generated from the organic light emitting (OLE) material itself, which allows a pixel to be turned completely off. As a result, OLED displays can have a higher contrast ratio and can display images that are more vibrant. Additionally without the need for a backlight, OLED displays can consume much less power. Due to the OLE material producing its own light, the OLED displays can also have a wider viewing angle. This can be in comparison to LCDs, which work by blocking light that can lead to obstruction of certain viewing angles. Furthermore, OLEDs have a wider operating temperature range, unlike LCDs which include a liquid crystal material that cannot operate at extreme temperatures.

There are several types of OLEDs including, but not limited to, passive-matrix OLEDs (PMOLEDs), active-matrix OLEDs (AMOLEDs), transparent OLEDs, cathode-common OLEDs, anode-common OLEDs, White OLEDs (WOLEDs), and RGB-OLEDs. The different types of OLEDs can have different uses, configurations, and advantages. Examples of the disclosure can include any of the types of OLEDs and are not limited to one type. The principle of how an OLED works is generally the same for all types of OLEDs, and will be discussed below.

Figure 2A:
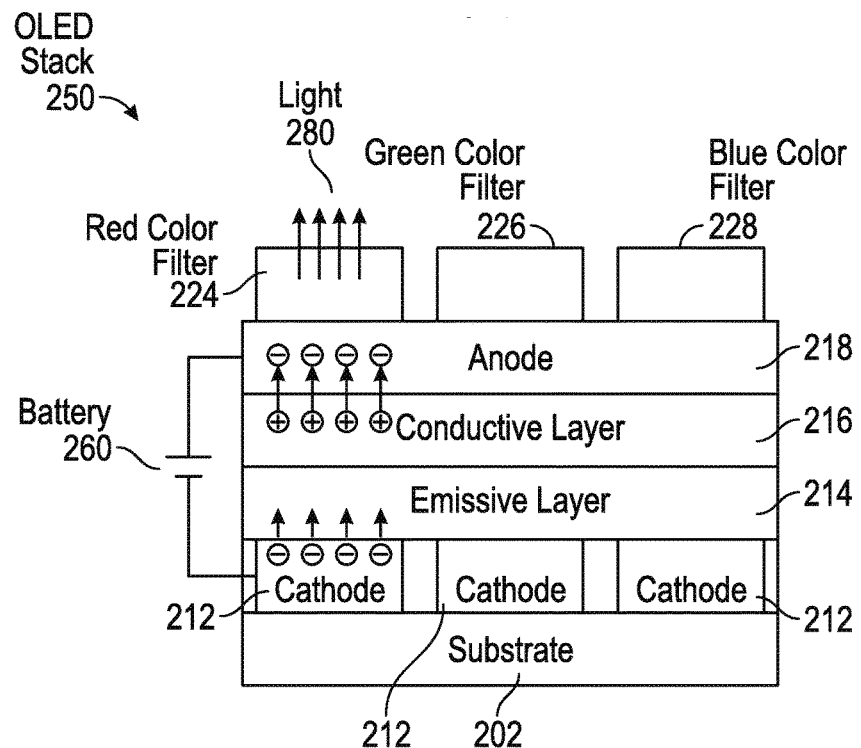
FIG. 2A illustrates an exemplary White OLED stack.
Figure 2B:
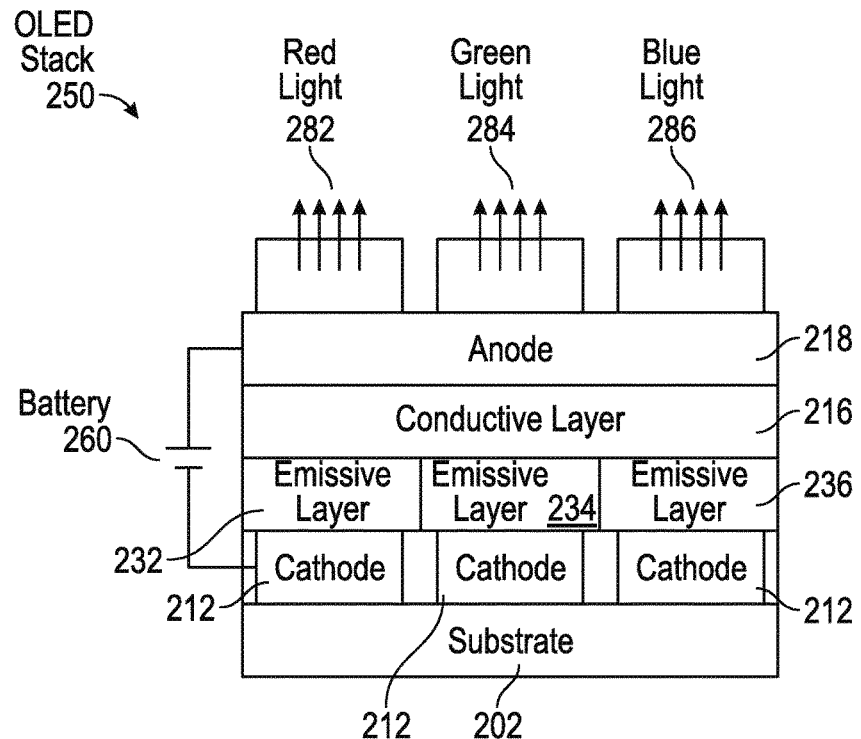
FIG. 2B illustrates an exemplary RGB OLED stack.

FIGS. 2A-2B illustrate cross-sectional views of exemplary OLED display stacks. An OLED display can be a display device that emits light using a process called electroluminescence. Electroluminescence is a phenomenon where a material can emit light in response to an electric current passing through the material. The OLED stack can include a stack of material layers through which each pixel or subpixel can be controlled using a matrix of transistors or switches. In an OLED stack, the material that emits light is known as the emissive layer. Coupling the emissive layer with a conductive layer, an electric current can pass through the OLED stack. The OLE material can be an organic polymer or small molecules. Polymers for the emissive layer can include, but are not limited to, Polyphenylenevinylene and Polyfluorene. Polymers for the conductive layer can include, but are not limited to, Polyaniline and Polyethylenedioxythiophene. The emissive layer and conductive layer can be coupled to an anode and a cathode. The anode and cathode can couple to a source of electricity such as a battery or power supply.

Referring to FIG. 2A, OLED stack 250 can include a cathode 212, an emissive layer 214, a conductive layer 216, and an anode 218 disposed on a glass or plastic substrate 202. A battery or power supply 260 can be coupled to the cathode 212 and anode 218, and a current can be applied across the OLED stack 250. As a current is applied across the OLED stack 250, the electrical current can flow from the cathode 212 to the emissive layer 214, supplying electrons to the emissive layer 214 and causing the emissive layer 214 to become negatively charged. The anode 218 can remove electrons from the conductive layer 216, leaving behind holes in the conductive layer 216 that can be filled with electrons and causing the conductive layer 216 to be positively charged. This scenario leaves an excess of electrons in the emissive layer 214 and an excess of holes in the conductive layer 216. Electrostatic forces can cause electrons from the positively charged conductive layer 216 to recombine with the holes in the negatively charged emissive layer 214. As the electrons and holes recombine, they release extra energy in the form of a photon generating light 280.

In some examples, the OLED stack can include hole injection layers (HIL), hole transport layers (HTL), electron injection layers (EIL), emissive layers (EML), and electron transport layers (ETL). The color of the light 280 emitted can depend on the type of OLE material (used for the emissive layer 214). The different emission colors can be obtained with a variety of chemical structures of the organic material. The intensity of light (e.g., brightness of the OLED display) can depend on the number of emitted photons or the current applied from the battery 260.

Depending on the OLED configuration and the OLE material, the OLED stack 250 can include one or more color filters. FIG. 2A illustrates an exemplary White OLED (WOLED) structure. In a WOLED structure, the OLE material (emissive layer 214) can generate white light. One or more color filters can be used to filter out different colors. For example, red color filter 224 can filter out all colors except red. Green color filter 226 can filter out all colors except green, and blue color filter 228 can filter out all colors except blue. In some examples, color filters 224, 226, and 228 can be formed using a cholesteric filter material such as a multilayer dielectric stack that includes materials with different indices of refraction configured to form an optical filter. FIG. 2B illustrates an exemplary RGB OLED stack. In a RGB OLED stack, different OLE materials can be used to emit the different colors. For example, emissive layer 232 can be formed of an OLE material that emits red light 282, emissive layer 234 can be formed of an OLE material that emits green light 284, and emissive layer 236 can be formed of an OLE material that emits blue light 286.

Figure 3A:
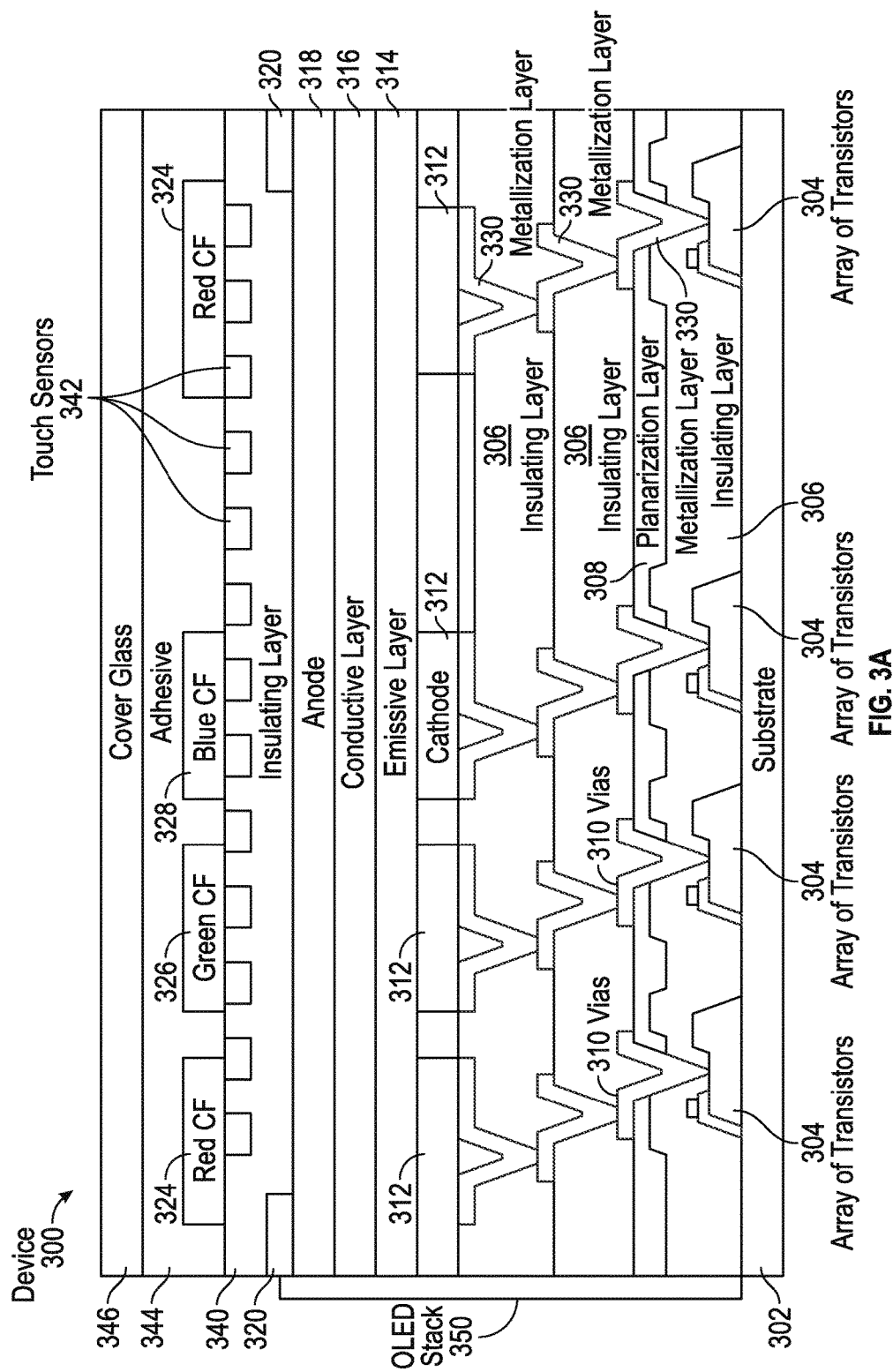
FIG. 3A illustrates a cross-sectional view of an exemplary integrated OLED display and touch sensor panel fabricated on glass or plastic.
Figure 3B:
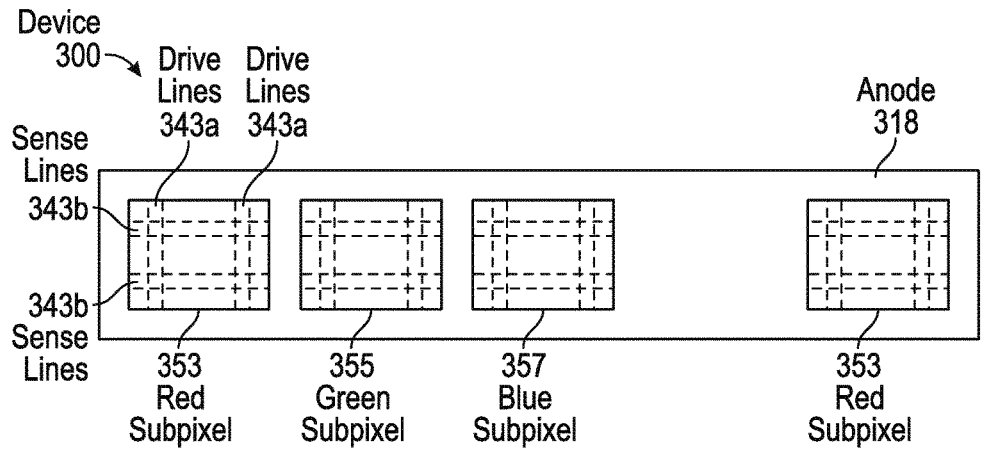
FIG. 3B illustrates a top view of an exemplary integrated OLED display and touch sensor panel fabricated on glass or plastic.
Figure 3C:
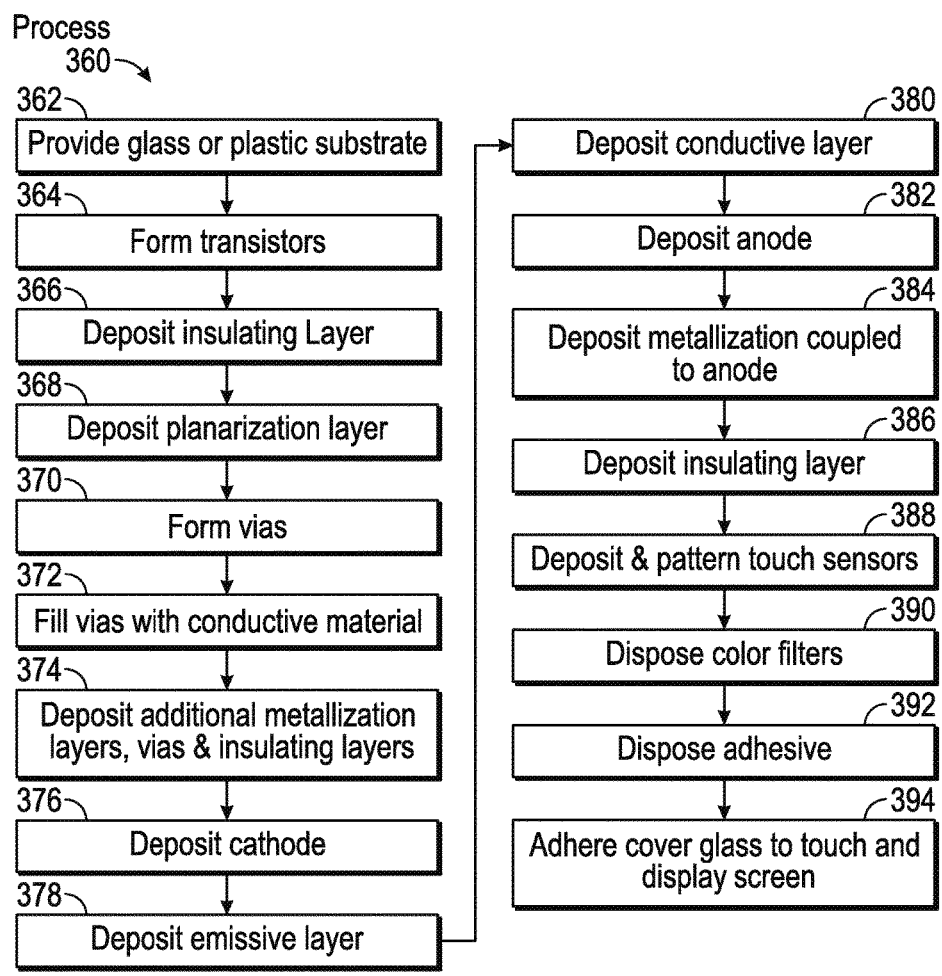
FIG. 3C illustrates a flow diagram for forming an exemplary integrated OLED display and touch sensor panel fabricated on glass or plastic.

FIG. 3A illustrates a cross-sectional view, FIG. 3B illustrates a top view, and FIG. 3C illustrates a flow diagram for forming an exemplary integrated OLED display and touch sensor panel fabricated on glass or plastic. Device 300 can include a substrate 302, such as plastic or glass, provided in step 362 of process 360. In step 364, an array of transistors 304 can be formed on substrate 302. Transistors 304 can be, for example, thin-film transistors (TFTs) used to drive the subpixels (red subpixel 353, green subpixel 355, and blue subpixel 357) of the OLED stack 350. In step 366, an insulating layer 306 can be formed on substrate 302 to reduce electrical interference for the array of transistors 304 or other electrical components within the structure. In step 368, a planarization layer such as planarization layer 308 can be optionally formed on the insulating layer 306 to form a substantially planar surface for subsequent deposition, patterning, or other fabrication processes. Vias such as via 310 can be formed in the planarization layer 308 and insulating layer 306 in step 370. In step 372, vias 310 can be filled with a conductive material, such as metallization. One or more metallization layers 330, vias 310, and insulating layers 306 can be formed for routing traces and other circuitry in step 374. In step 376, a metallization layer can be disposed on the planarization layer to form cathode 312. A layer of organic light emitting (OLE) material for the emissive layer 314 can be applied or deposited on cathode 312 in step 378. Conductive layer 316 can be deposited on emissive layer 314 in step 380, and a metallization layer can be disposed on conductive layer 316 to form an anode 318 in step 382. In step 384, another metallization 320 can be disposed on anode 318. Metallization 320 can be used to couple power or ground to anode 318. Additional layers can be disposed on anode 318 and metallization layer 320 such as passivation layers and shielding layers. In step 386, insulating layer 340 can be disposed on the additional layers and anode 318 to electrically isolated and protect the OLED stack 350. In step 388, touch sensors 342 can be deposited on metallization 320 and insulating layer 340 and patterned to form drive lines and sense lines. Touch sensors 342 can be any transparent conductive material such as ITO. Red color filter (CF) 324, green CF 326, and blue CF 328 can be disposed on touch sensors 342 and insulating layer 340 in step 390. In step 392, adhesive layer 344 can be disposed on red CF 324, green CF 326, and blue CF 328 and can be used for adhering a cover glass 346. Cover glass 346 can be adhered to or integrated with the touch and display screen in step 394. Cover glass 346 can be glass or any cover material that can protect the device 300 from damage and degradation.

While an integrated touch and OLED display panel can be formed by overlaying a touch sensor array over the OLED display, a brightness of the images displayed by the OLED stack 350 can be compromised. Although the touch sensors 342, insulating layer 340, adhesive 344, and cover glass 346 are made of a transparent materials, these materials are not entirely transparent, and therefore the quality of a displayed image can degrade as the display is located further away from the display surface (e.g., when components of the device such as the touch sensors 342 overlay the OLED stack 350). Furthermore, as shown in FIG. 3B, the drive lines 343a and sense lines 343b for the touch sensors 342 can cause optical artifacts. Additionally, the extra layers for the touch sensors 342 and insulating layer 340 can lead to added overall thickness of the device 300.

Figure 4A:
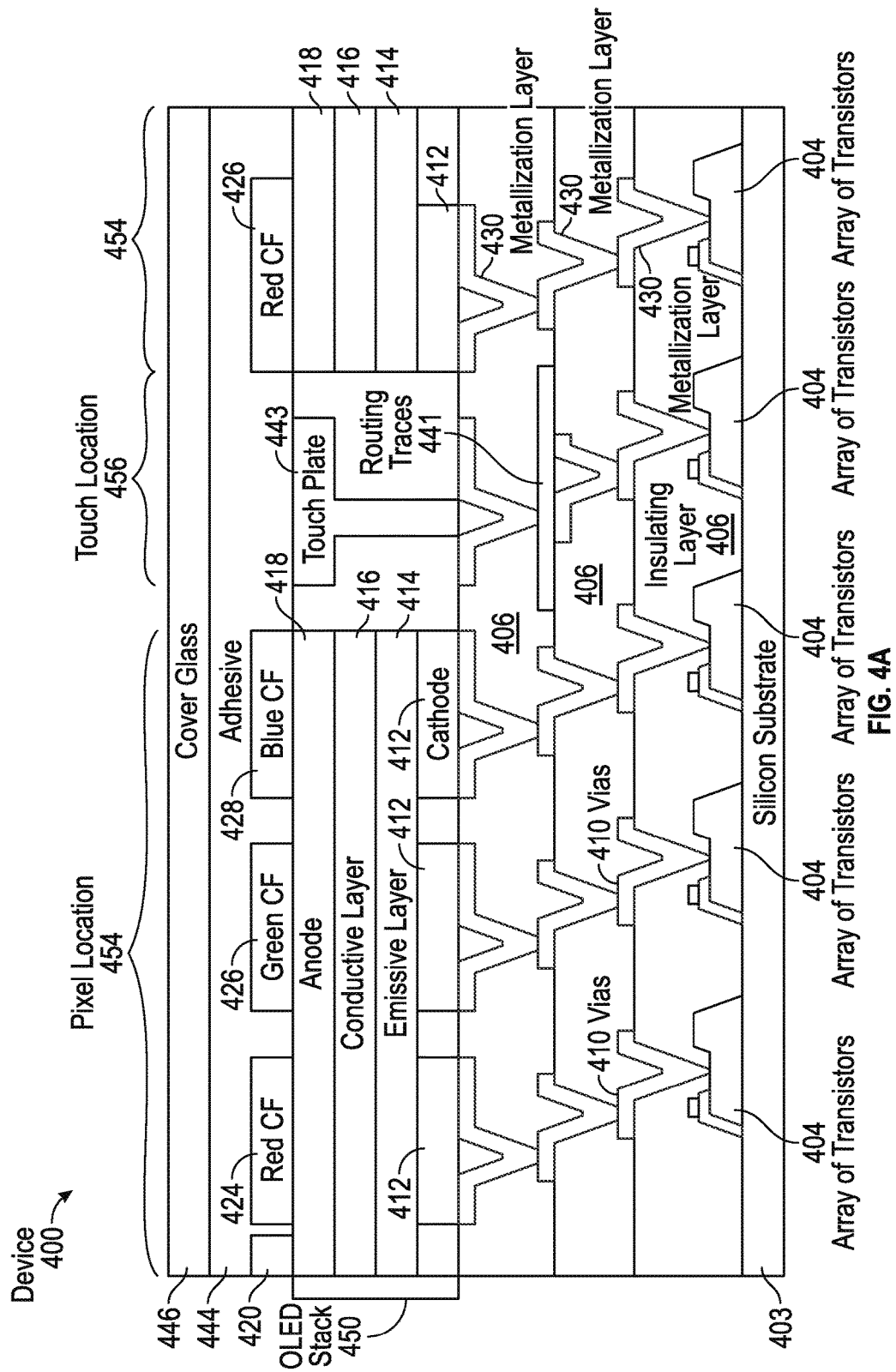
FIG. 4A illustrates a cross-sectional view of an exemplary integrated Silicon-OLED display and touch sensor panel according to examples of the disclosure.
Figure 4B:
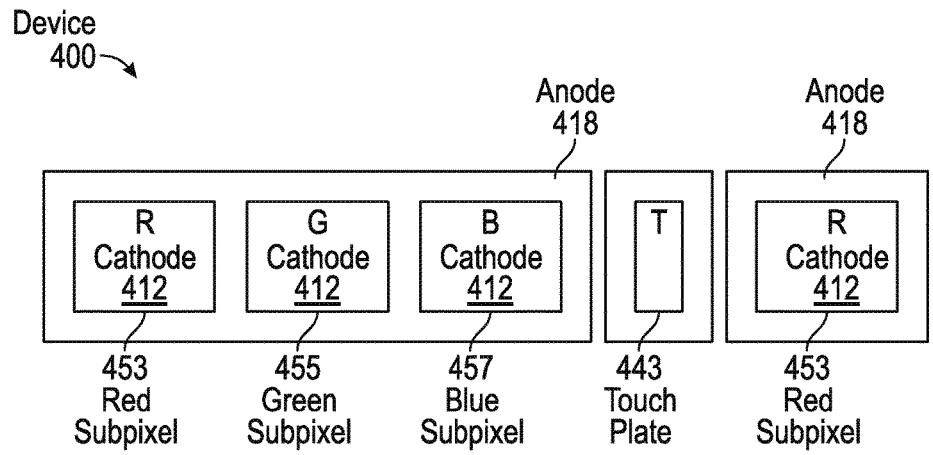
FIG. 4B illustrates a top view of an exemplary integrated Silicon-OLED display and touch sensor panel according to examples of the disclosure.
Figure 4C:
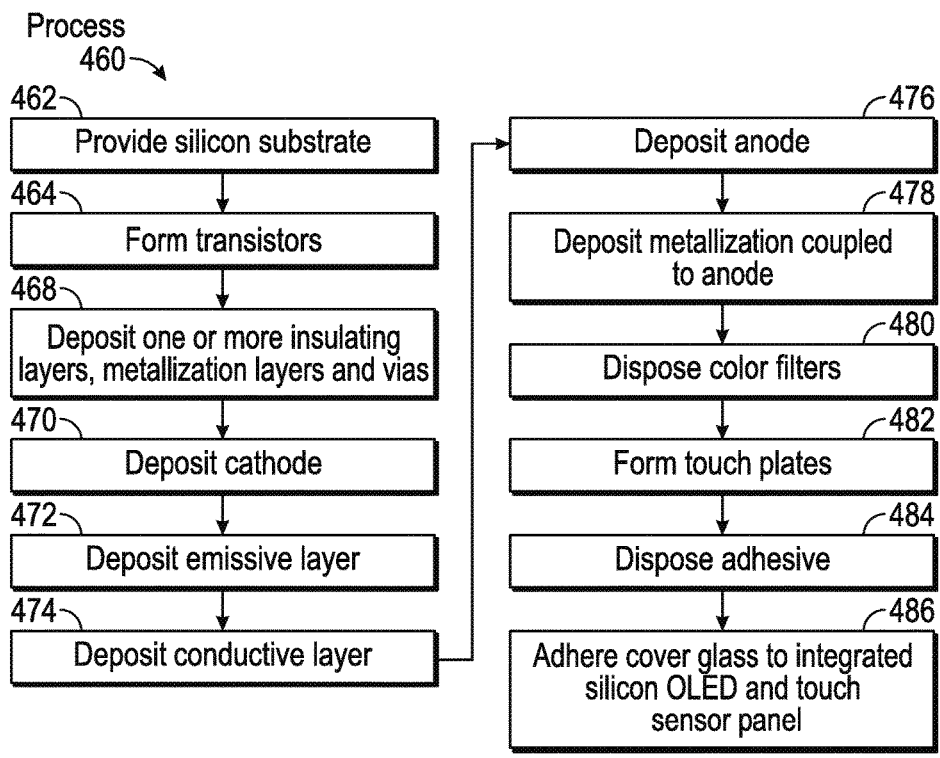
FIG. 4C illustrates a flow diagram for forming an exemplary integrated Silicon-OLED display and touch sensor panel according to examples of the disclosure.

To alleviate or overcome one or more of the above mentioned issues with the integrated touch and OLED display panel as exemplified in FIGS. 3A-3C, the OLED stack and touch sensors can be formed on a Silicon substrate. FIG. 4A illustrates a cross-sectional view, FIG. 4B illustrates a top view, and FIG. 4C illustrates a flow diagram for forming an exemplary integrated Silicon-OLED display and touch sensor panel. Device 400 can include a Silicon substrate 403, provided in step 462 of process 460. Silicon substrate 403 can be planar or curved. In step 464, an array of transistors 404 can be formed on substrate 403. Array of transistors 404 can be, for example, thin-film transistors (TFTs) used to drive subpixels 453, 455, and 457 and/or can be used for touch sensing circuitry. In step 468, one or more insulating layers 406, metallization layers 430, and vias 410 can be formed on substrate 403 for additional circuitry and/or to form connections to circuitry.

In a pixel location 454, red subpixels 453, green subpixels 455, and blue subpixels 457 can be formed. Subpixels 453, 455, and 457 can include a metallization layer to form a cathode 412 on the one or more insulating layers 406, metallization layers 430, and vias 410. Cathode 412 can be formed in step 470. An emissive layer 414 can be disposed or deposited on cathode 412 in step 472, and a conductive layer 416 can be disposed on the emissive layer 414 in step 474. In step 476, a metallization layer can be disposed on the OLE material or emissive layer 414 to form anode 418. The cathode 412, emissive layer 414, conductive layer 416, and anode 418 can be included in the OLED stack 450. In step 478, another metallization 420 can be disposed on anode 418 to couple the anode 418 to power or ground. In step 480, color filters such as red CF 424, green CF 426, and blue CF 428 can be disposed on anode 418 in the pixel location 454. In some examples, a white OLED can be fabricated using the appropriate OLE material and different red, green, and blue color filters can be disposed over the white OLE material, as shown in FIG. 4A. In some examples, an RGB OLED can be fabricated using separate OLE materials for the different colors. Color filters can optionally be used.

Due to the capability of achieving an extremely high number of pixels per inch (PPI) when forming the OLED stack on a Silicon substrate, the subpixels for displaying an image can be formed on a same layer as the touch sensor array. In a touch location 456, one or more touch sensors such as touch plate 443 can be formed on the same layer as the anode 418 of the OLED stack (step 482). Touch plate 443 can be coupled to touch sensing circuitry by using routing traces 441 and vias 410. In some examples, routing traces 441 for touch sensing circuitry and the touch plate 443 can be formed on the same layer as the anode 418 in a border area of the device. In some examples, touch plate 443 can be coupled to a transistor 404. As will be described shortly, coupling the touch plate 443 to a transistor 404 can be used to switch the touch sensors on or off or can be used to couple touch sensors together. In steps 484 and 486, an adhesive 444 can be disposed and a cover glass 446 can be adhered to the device 400.

The one or more layers described above and below can be deposited using any number of techniques including, but not limited to, screen printing, spin-on coating, spray coating, roll-to-roll web coating, physical vapor deposition, chemical vapor deposition, or other suitable deposition techniques. The one or more layers described above and below can be patterned using any number of patterning techniques, including, but not limited to, laser ablation, chemical acid etching, dry etching, shadow masking, and photolithography/resist processes.

FIG. 4B illustrates a top view of device 400. A display pixel can include a red subpixel 453 (referred to as "R"), a green subpixel 455 (referred to as "G"), and a blue subpixel 457 (referred to as "B"). Display subpixels can be located next to touch plate 443 (referred to as "T"). Both the display subpixels and touch sensors of the integrated Silicon-OLED display and touch sensor panels can be located at the touch and display surface. Locating both the display subpixels and touch sensors at the touch and display surface can enhance the user's viewing experience without compromising touch sensitivity. Additionally, optical artifacts from the touch sensors can be reduced or eliminated.

Figure 5:
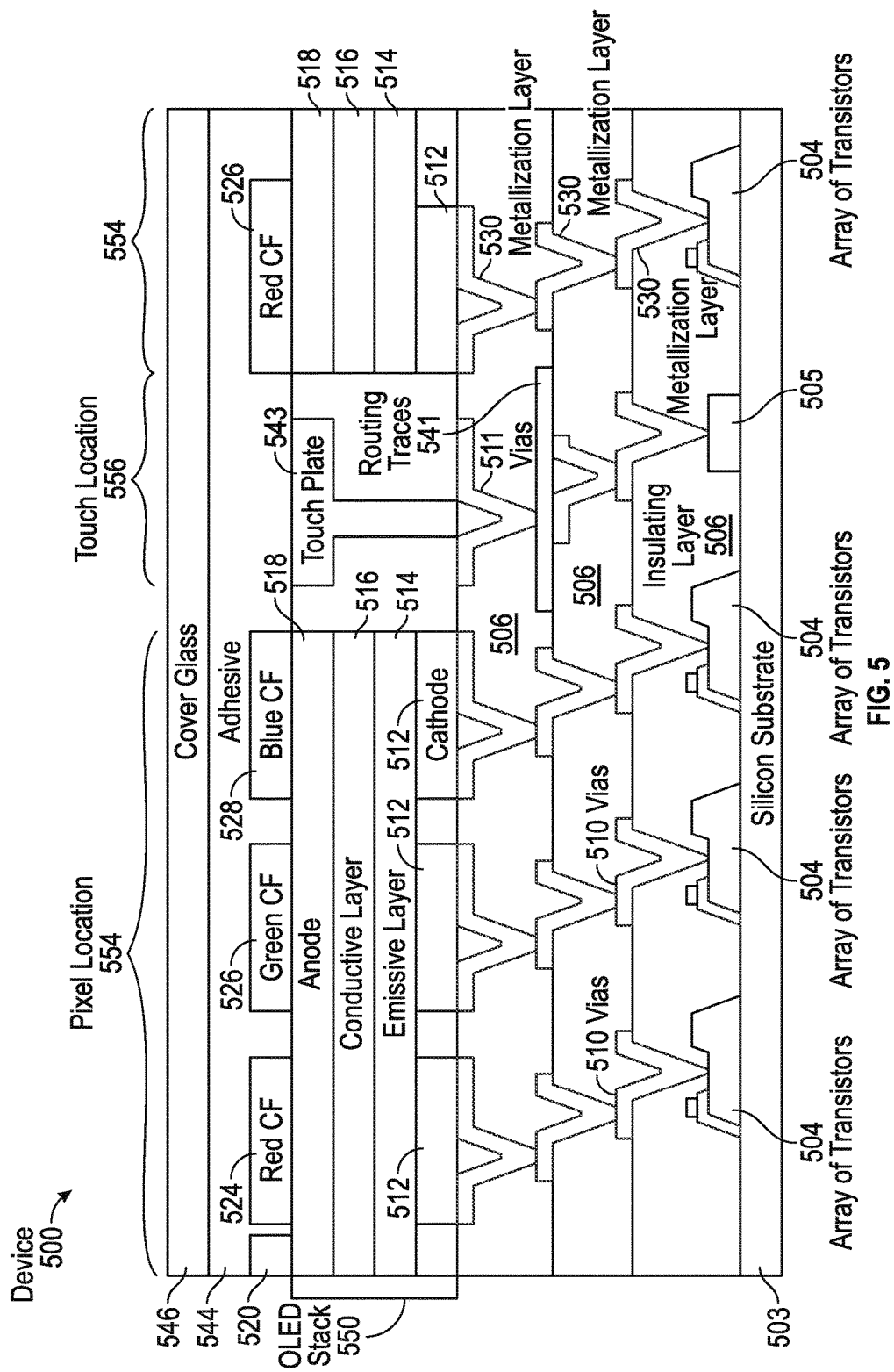
FIG. 5 illustrates a cross-sectional view of an exemplary Silicon-OLED display and touch sensor panel including an integrated electrostatic discharge device according to examples of the disclosure.

FIG. 5 illustrates a cross-sectional view of an exemplary Silicon-OLED display and touch sensor panel including an integrated electrostatic discharge device. Electronic devices, in general, can be susceptible to electrostatic discharge (ESD) events, which can be caused by external objects imparting electrostatic energy onto the device. In the instance of touch input devices, ESD events can generate a "false touch" on the touch screen; in other words, the device can think that a touch or proximity event has occurred when none exists. Furthermore, ESD events can also cause a device to ignore an actual touch or proximity event. For example, mutual capacitance touch sensor panels can be formed from a matrix of drive and sense lines of a substantially transparent conductive material such as ITO. The lines can be arranged orthogonally on a substantially transparent substrate. An ESD event can be coupled into the matrix of drive lines and sense lines, causing signals to appear that can be misinterpreted as a touch or proximity event. Also, ESD events can be coupled into the matrix of the drive and sense lines causing signals to appear as negative touches, such that when a touch occurs, it is missed. The false touches or missed touches can lead to an overall degradation of the user experience in that the device will register touches that the user did not intend and furthermore can miss actually touches intended by the user.

Device 500 can include a Silicon substrate 503. An array of transistors 504 can be formed on substrate 503. Transistors 504 can be, for example, TFTs used to drive subpixels used to display an image. Device 500 can also include one or more insulating layers 506, metallization layers 530, and vias 510 formed on substrate 503 to form additional circuitry and/or connections to circuitry.

In a pixel location 554, cathode 512 can be formed on the one or more insulating layers 506, metallization layers 530, and vias 510. An emissive layer 514 can be applied or deposited on cathode 512. A conductive layer 516 can be disposed on emissive layer 514, and an anode 518 can be disposed on conductive layer 516. Another metallization 520 can be disposed on anode 518 to couple anode 518 to power or ground. Color filters such as red CF 524, green CF 526, and blue CF 528 can be disposed on anode 518 in the pixel location 554. In some examples, routing to the matrix of transistors for the display can formed additionally or alternatively in border areas of the device and/or between subpixels.

In a touch location 556, one or more touch sensors such as touch plate 543 can be formed on the same layer as anode 518. Touch plate 543 can be routed to sensing circuitry using routing traces 541. In some examples, routing to the touch plate 543 can be formed on the same layer as any one of the metallization layers 530, insulating layers 506, layers of the OLED stack 550, or on the same layer as the color filters 524, 526, 528. An adhesive 544 can be applied on color filters 524, 526, and 528 and touch plate 543. A cover glass or cover material 546 can be adhered to the device 500 using the adhesive 544.

In some examples, an electrostatic discharge device 505 can be coupled to the touch sensor or touch plate 543. Touch plate 543 can be particularly vulnerable to ESD. Coupling the touch plate 543 to ESD device 505 can include forming additional vias 510 and metallization layers 530 located in the touch location 556. In some examples, ESD device 505 can be placed in the shortest distance, for example, coupled to via 511. By placing the ESD device in the shortest distance, damage to other circuitry can be prevented or minimized.

Figure 6A:
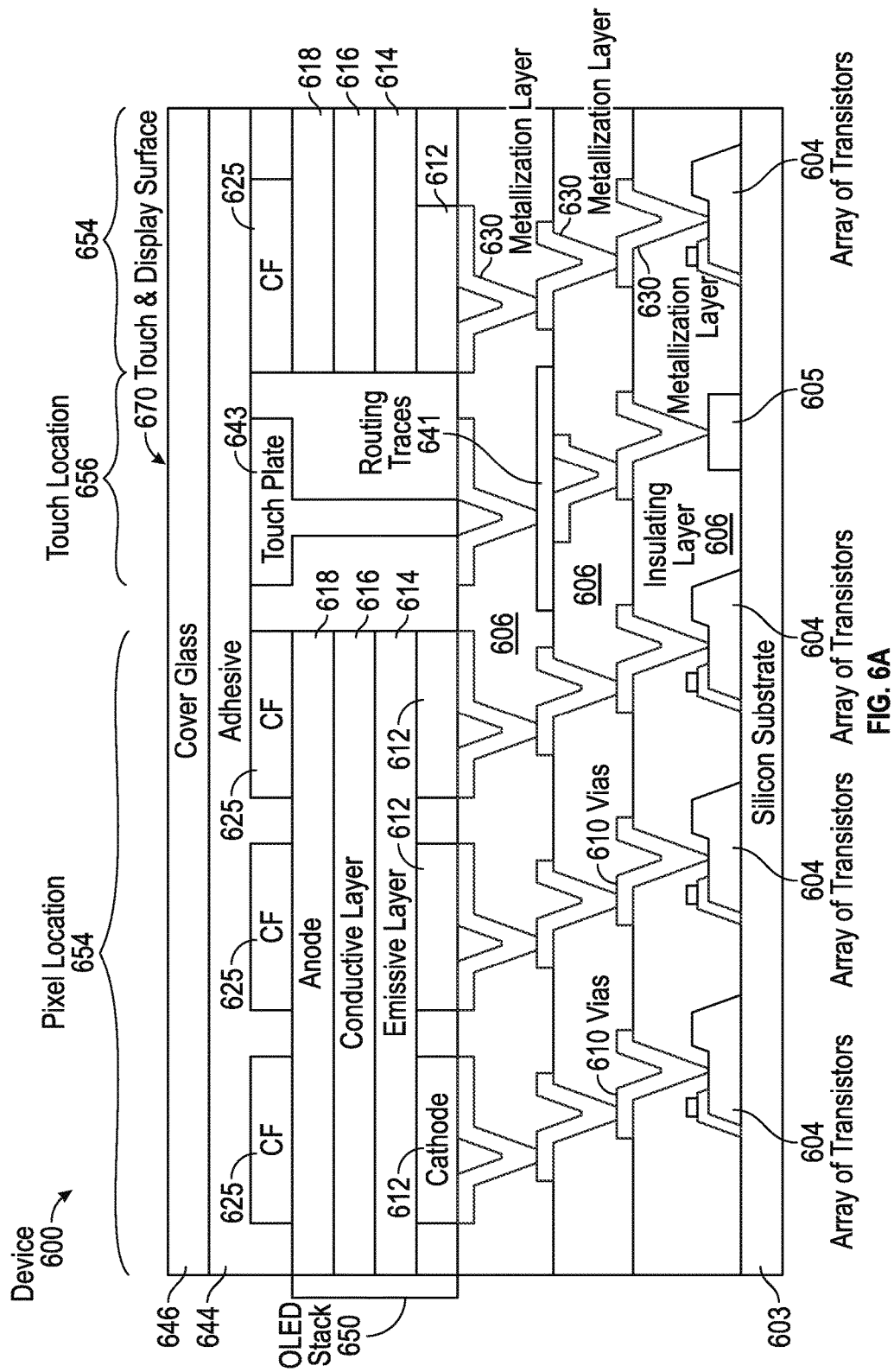
FIG. 6A illustrates a cross-sectional view of an exemplary Silicon-OLED display and touch sensor panel with touch sensors according to examples of the disclosure.
Figure 6B:
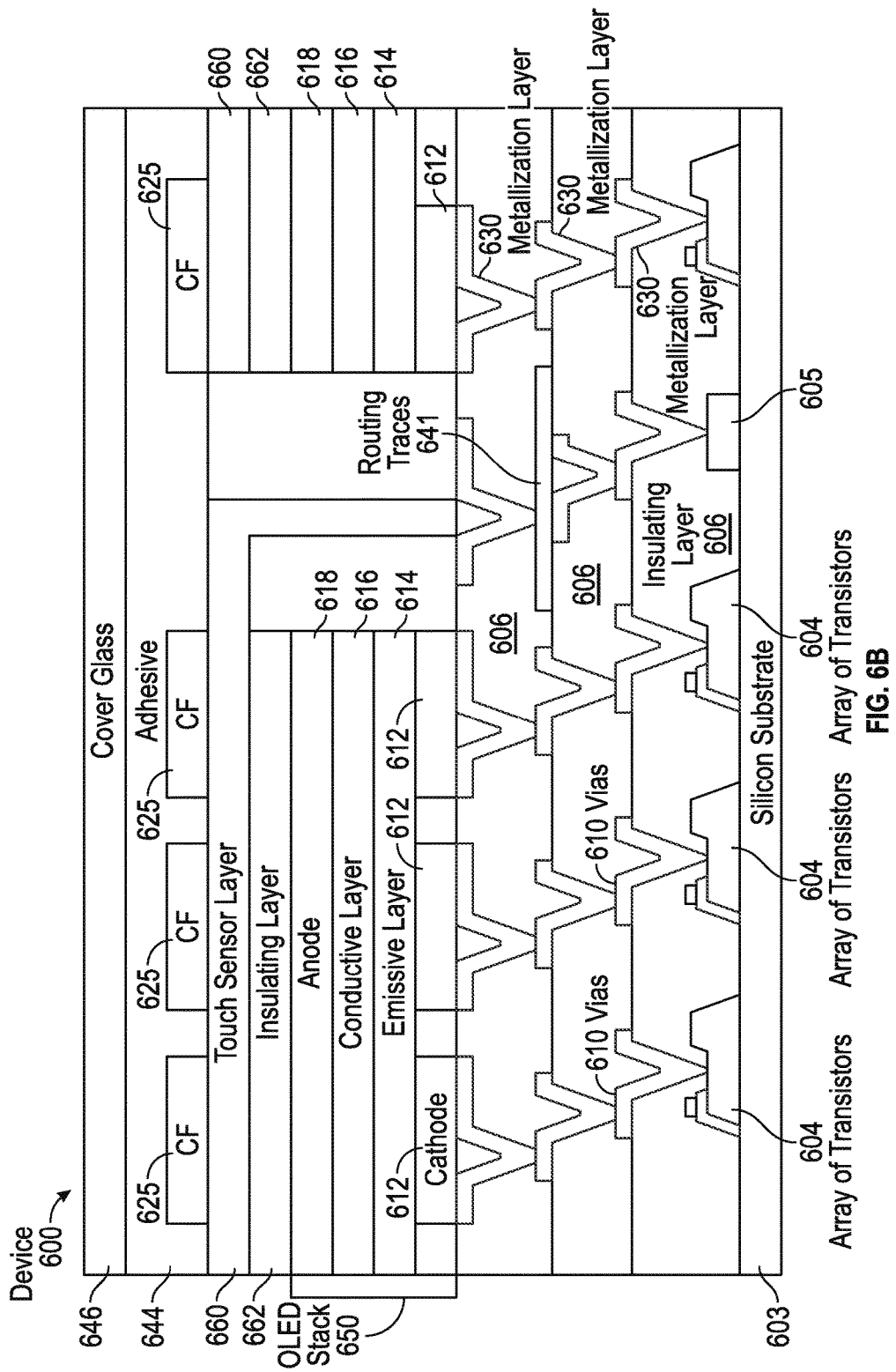
FIG. 6B illustrates a cross-sectional view of an exemplary Silicon-OLED display and touch sensor panel with a touch sensor layer according to examples of the disclosure.
Figure 6C:
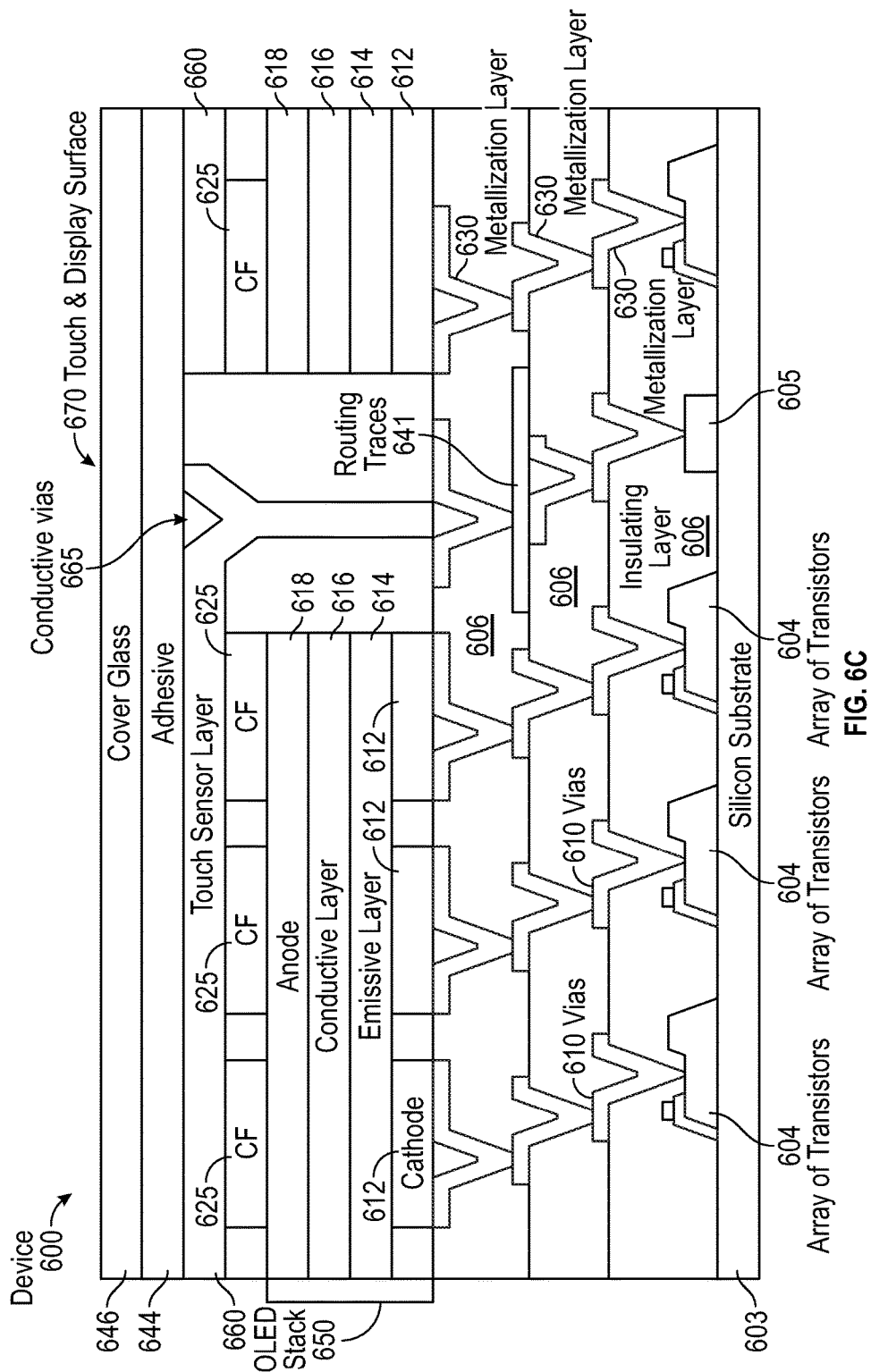
FIG. 6C illustrates a cross-sectional view of an exemplary Silicon-OLED display and touch sensor panel with a touch sensor layer located closer to the touch and display surface according to examples of the disclosure.

In some examples, the touch plates 443 of FIG. 4A and 543 of FIG. 5 can be small in size, and the sensitivity for sensing a touch or hover can lead to erroneous or missed touches. FIGS. 6A-6C illustrate exemplary Silicon-OLED display and touch sensor panel with enhanced touch sensitivity. Device 600 can include a Silicon substrate 603, an array of transistors 604, one or more insulating layers 606, one or more metallization layers 630, and one or more vias 610. In a pixel location 654, the OLED stack 650 can include a cathode 612, an emissive layer 614, a conductive layer 616, an anode 618, and color filters CF 625. Device 600 can further include ESD device 605 coupled to the touch sensors. Routing for the OLED subpixels and touch sensors can be formed in the one or more metallization layers 630, routing traces 641, and/or in the border area on the same layer as at least one of the layers of the OLED stack 650. Device 600 can include an adhesive 644 and cover glass 546.

In the exemplary device 600 of FIG. 6A, touch sensitivity can be enhanced by locating the touch plate 643 on the same layer as the color filters CF 625, and closer to the touch and display surface 670. In some examples, the sensitivity for sensing a touch can be enhanced by increasing the size of the touch plate 643. In some examples, the sensitivity for sensing a touch can be enhanced by arranging two or more touch plates 643 side by side and electrically coupling multiple touch plates 643 together.

FIG. 6B illustrates a cross-sectional view of an exemplary Silicon-OLED display and touch sensor panel with enhanced touch sensitivity. The touch sensitivity of device 600 can be enhanced with a larger sized touch sensor such as touch sensor layer 660. Touch sensor layer 660 can have, for example, 2-10 times larger surface area than touch plate 643 of FIG. 6A. In some examples, the touch sensor layer 660 can have the same area as a display pixel. To electrically isolate touch sensor layer 660 from the anode 618, an insulating layer 662 can be disposed between the touch sensor layer 660 and the insulating layer 662.

The touch sensitivity of the device can be enhanced even further by locating the touch sensor layer 660 closer to the touch and display surface 670. Locating the touch sensor layer 660 below the color filters CF 625 can lead to an unwanted gap between the touch object and the touch sensor layer 660. This unwanted gap can be due to the height of the color filters CF 625 where erroneous touches or decreased touch sensitivity can result. The color filters CF 625 can be, for example, 200 μm in height. As shown in FIG. 6C, device 600 can include a touch sensor layer 660 disposed on the color filters CF 625 and located closer to the touch and display surface 670 or cover glass 646. The additional insulating layer, such as insulating layer 662 in FIG. 6B, can be omitted. Additionally, the parasitic capacitance can be reduced due to locating layers or elements dedicated to the OLED stack 650 close together and locating layers or elements dedicated to touch sensing close together. A conductive via 665 can be formed and filled with metal to couple to routing traces.

Figure 6D:
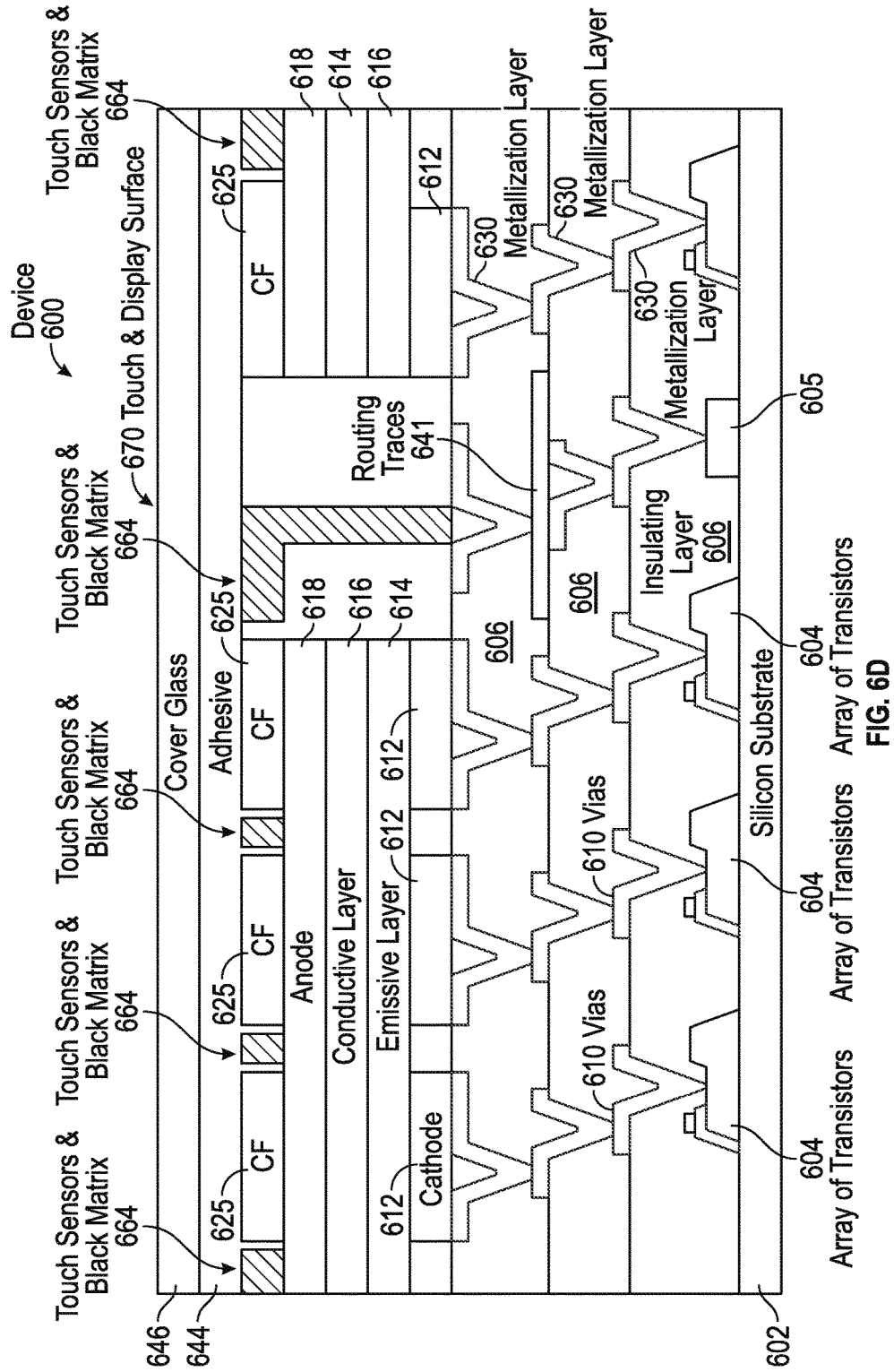
FIG. 6D illustrates a cross-sectional view of an exemplary Silicon-OLED display and touch sensor panel with touch sensors and black matrix according to examples of the disclosure.

While the exemplary devices of FIGS. 6B and 6C can enhance the touch sensitivity, the quality of perceived image can be compromised due to the touch sensor layer 660 located in the path between the OLED stack and the touch and display surface 670. FIG. 6D illustrates an alternative example of locating the touch sensor closer to the touch and display surface 670. A conventional display can include a black matrix. A black matrix is an array of opaque conductive elements that can separate individual pixels and can be disposed between the color filters. In some examples, the black matrix can serve as light shielding to prevent color mixing between neighboring subpixels. The black matrix can be an opaque (e.g., black) masking material such as an inorganic opaque material (e.g., chrome) or an organic opaque material (e.g., black ink or black plastic). In some examples, a same black masking material can also be used to form a border mask in the peripheral border area (e.g., a ring surrounding a central active area of the panel). In some examples, device 600 can include multi-functional elements such as touch sensors and black matrix 664. Touch sensors and black matrix 664 can function as touch sensors and can also function as a black matrix. In some examples, touch sensors 664 can be made of an opaque conductive material. In some examples, touch sensors 664 can be a multi-layer thin film stack such as a two-layer stack with one layer serving as the touch sensors and the other layer serving as a black matrix.

The integrated Silicon-OLED display and touch sensor panel can be configured in any number of arrangements. FIG. 7A illustrates a close-up top view of an exemplary arrangement of an integrated Silicon-OLED display and touch sensor panel according to examples of the disclosure. Device 700 can include a matrix of display subpixels and touch sensors. In some examples, the display subpixels are arranged in groups 751. Each group of subpixels 751 can include a red subpixel (referred to as "R"), a green subpixel (referred to as "G"), and a blue subpixel (referred to as "B"). Touch sensors 743 (referred to as "T") can be located between each group of subpixels 751. For example, a configuration of the integrated Silicon-OLED display and touch sensor panel can include a RGBT/RGBT/RGBT arrangement, as shown in FIG. 7A. In some examples, the panel can include alternative arrangements, such as a RGBT/RGB/RGBT arrangement or a TGB/RTB/RGT arrangement.

Figure 7B:
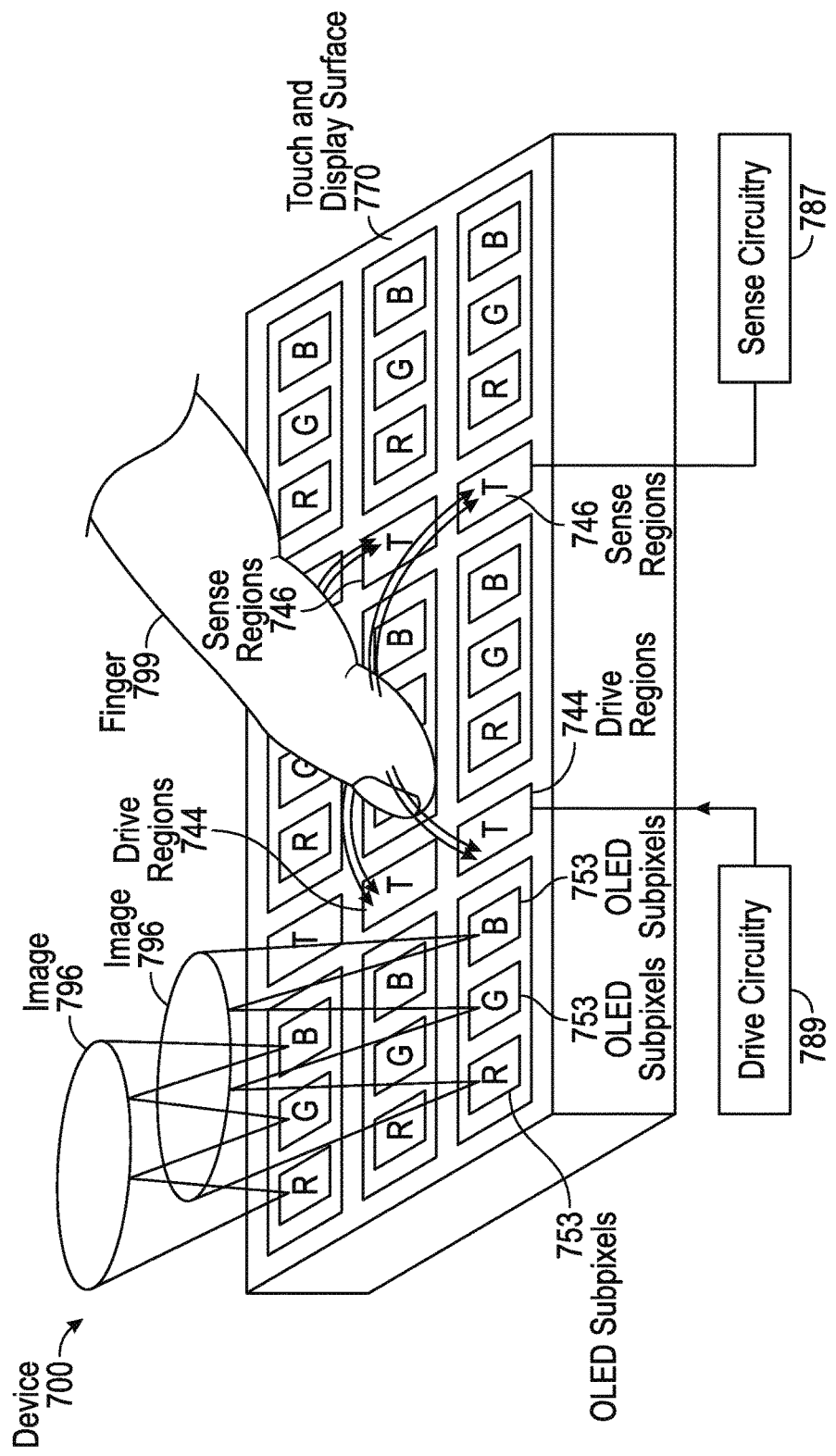
FIG. 7B illustrates a top view of an exemplary integrated Silicon-OLED display and touch sensor panel including a plurality of clusters according to examples of the disclosure.

FIG. 7B illustrates an exemplary integrated Silicon-OLED display and touch sensor panel employing mutual-capacitive sensing according to various examples of the disclosure. Device 700 can sense an object such as a finger 799 touching or hover over the display and touch surface 770. The OLED subpixels 753 can display an image 796. At a same time or at a different time, drive touch sensors or drive regions 744 can be coupled to drive circuitry 789. Drive circuitry 789 can transmit drive signals to drive regions 744. Due to the close proximity of the drive regions 744 to sense regions 746, electric field lines can form between the stimulated drive regions 744 and the sense regions 746. When finger 799 touches or near touches in the appropriate region, the finger 799 can block some of the electric field lines extending from the drive regions 744 to the sense regions 746, thereby reducing the amount of charge coupled to the nearby sense regions 746. The reduction in charge can be sensed by sense circuitry 787, coupled to the sense regions 746, as an "image" of touch. The touch image can be transmitted to a touch controller for further processing. Drive regions 744 and sense regions 746 can be any type of touch sensor such as touch plate 643 and touch sensor layers 660 of FIGS. 6A-6D.

When finger 799 is removed from the proximity of the drive region 744 and the sense region 746, the charge emanating from the drive region 744 may no longer partially coupled onto finger 799. Thus, the amount of charge coupled onto sense region 746 can increase. Finger 799 generally can only couple charge from the drive region 744 if it is touching or in near proximity to the drive regions 744 and sense regions 746 and blocking some electric field lines. Once the finger is moved away from the proximity of the drive regions 744 and sense regions 746 and is a certain distance away, the charge may no longer coupled onto finger 799. The sense regions 746 can no longer detect the presence of the finger 799, and sense regions 746 will not register a touch or proximity event. Thus, touch sensors employing mutual capacitance sensing can have limited range of distance over which the system can detect proximity events.

Figure 7C:
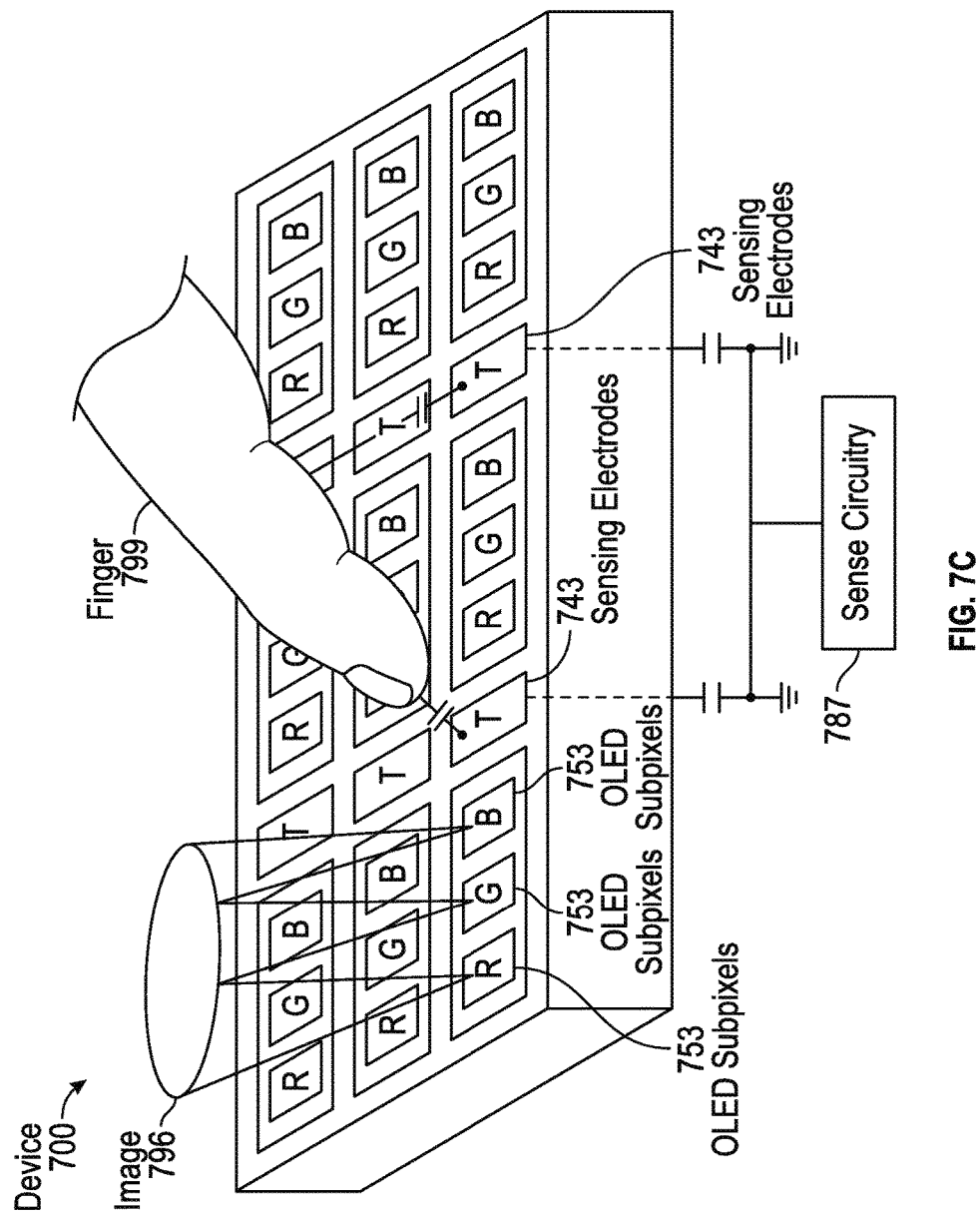
FIG. 7C illustrates a top view of an exemplary integrated Silicon-OLED display and touch sensor panel with a staggered arrangement according to examples of the disclosure.

Touch sensors that employ self-capacitance to detect touch or proximity events can be used to detect the presence of a finger or object that is further away from the touch sensors than in a device that uses mutual capacitance. FIG. 7C illustrates an exemplary integrated Silicon-OLED display and touch sensor panel employing self-capacitive sensing according to various examples of the disclosure. Device 700 can sense an object such as finger 799 touching or hovering over the touch and display surface. OLED subpixels 753 can display an image 796. Touch sensors or sensing electrodes 743 can be coupled to sense circuitry 787 and can have a self-capacitance to ground. When finger 799 touches or is in close proximity to sensing electrodes 743, an additional capacitance can be formed between the sensing electrodes 743 and ground through finger 799. The additional capacitance can increase the self-capacitance of the sensing electrodes 743. This change in self-capacitance of the sensing electrodes 743 can be detected by sense circuitry 787. Unlike the exemplary mutual capacitance device of FIG. 7B, each sensing electrode 743 can act as a touch node instead of having pairs of drive regions 744 and sense regions 746. As a result, such a self-capacitance architecture can possess a touch resolution that can be less than the mutual capacitance touch resolution.

Since the self-capacitance architecture can have a reduced spatial resolution when compared to a mutual capacitance architecture, a self-capacitance touch sensor panel may not be able to detect a touch or proximity event location with as much accuracy or ambiguity as a mutual capacitive touch sensor panel. However, due to the high PPI of the integrated Silicon-OLED display and touch sensor panel, the number of sensing electrodes for the self-capacitive device of FIG. 7C can lead to a resolution that can be comparable or greater than the resolution of both conventional mutual-capacitive and self-capacitive touch sensor panels (e.g., a self-capacitance touch sensor panel formed on a glass or plastic substrate).

In some examples, the density of touch sensors can be large enough such that an object touching or hover over the touch and display surface can couple to more than one touch sensor. To conserve on power, multiple groups of subpixels and touch sensors can be grouped together into clusters. For example, as illustrated in FIG. 7A, cluster 780 can include 15 groups of subpixels 751 and touch sensors 743, and cluster 782 can include 15 different groups of subpixels 751 and 15 different touch sensors 743. Touch sensors 743 belonging to the same cluster can be coupled together at location 784 and routed using routing trace 786 to touch controller 788. Touch controller 788 can sense a touch or hover at any one of the touch sensors 743 in a cluster. Signals to the touch sensors can be routed through routing traces, vias, and one or more of the underlying metallization layers (such as routing traces 641 of FIGS. 6A-6D).

FIG. 7D illustrates a top view of an exemplary integrated Silicon-OLED display and touch sensor panel including a plurality of clusters. Device 700 can include a plurality of clusters such as cluster 780 and cluster 782. Each cluster can have a X, Y coordinate value corresponding to a touch location. The plurality of clusters can be coupled to touch controller 788. The touch controller 788 and a processor can drive and sense the plurality of clusters sequentially or concurrently to form an image of touch.

Due to the high PPI, multiple touch sensors can be distributed throughout the panel without being noticed. In some examples, the placement of the groups of subpixels 751 can be staggered to prevent the touch sensors 743 from forming a visually noticeable pattern (such as the line of touch sensors 790 of FIG. 7A), as exemplified in FIG. 7E. In some examples, routing traces 786 for the touch sensors 743 can formed on the same plane as the groups of subpixels 751 and touch sensors 743 and in an area between the rows and/or in other outside areas (e.g., border areas of the device).

Figure 7E:
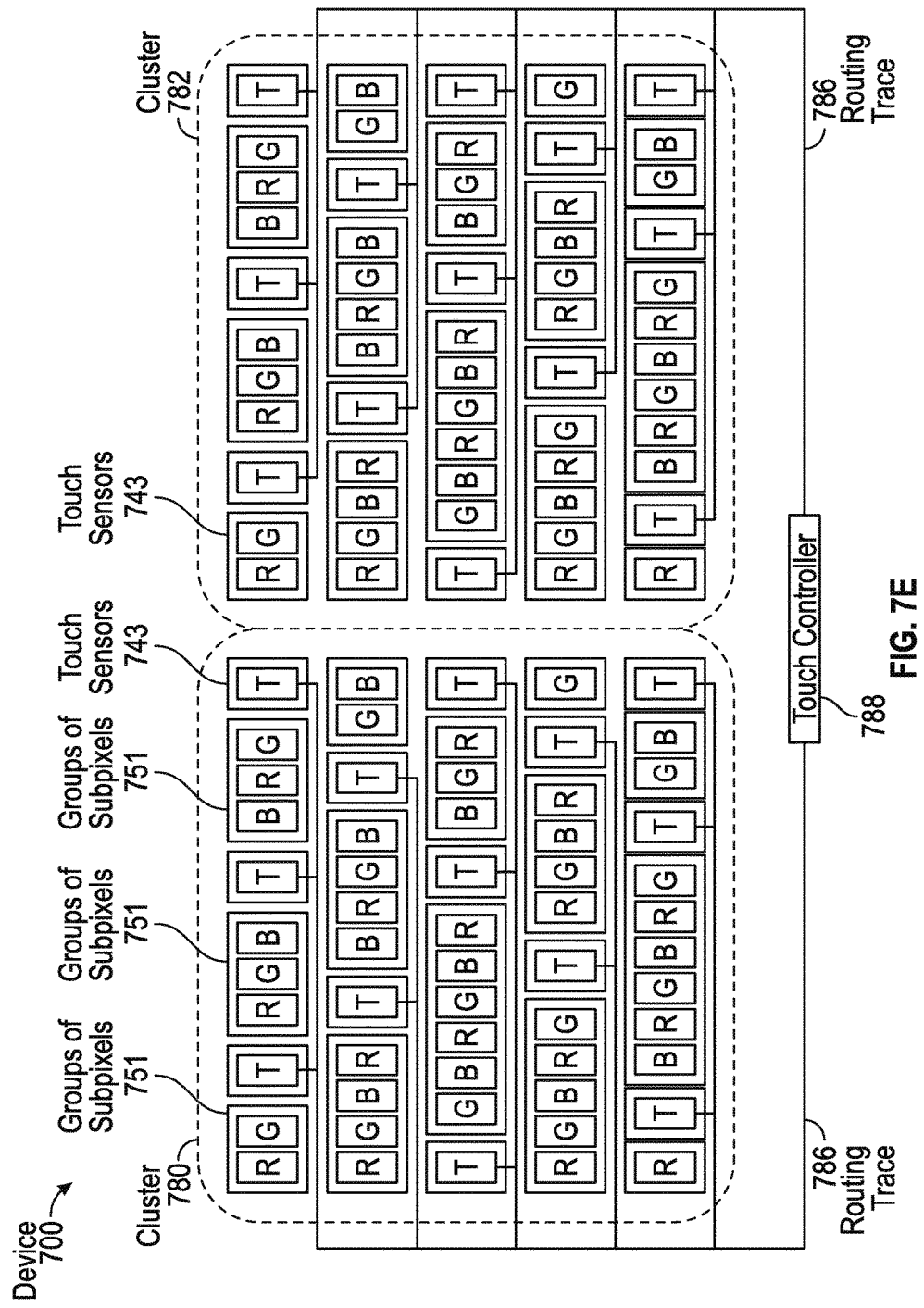
FIG. 7E illustrates an exemplary integrated Silicon-OLED display and touch sensor panel employing mutual-capacitive sensing according to examples of the disclosure.
Figure 7F:
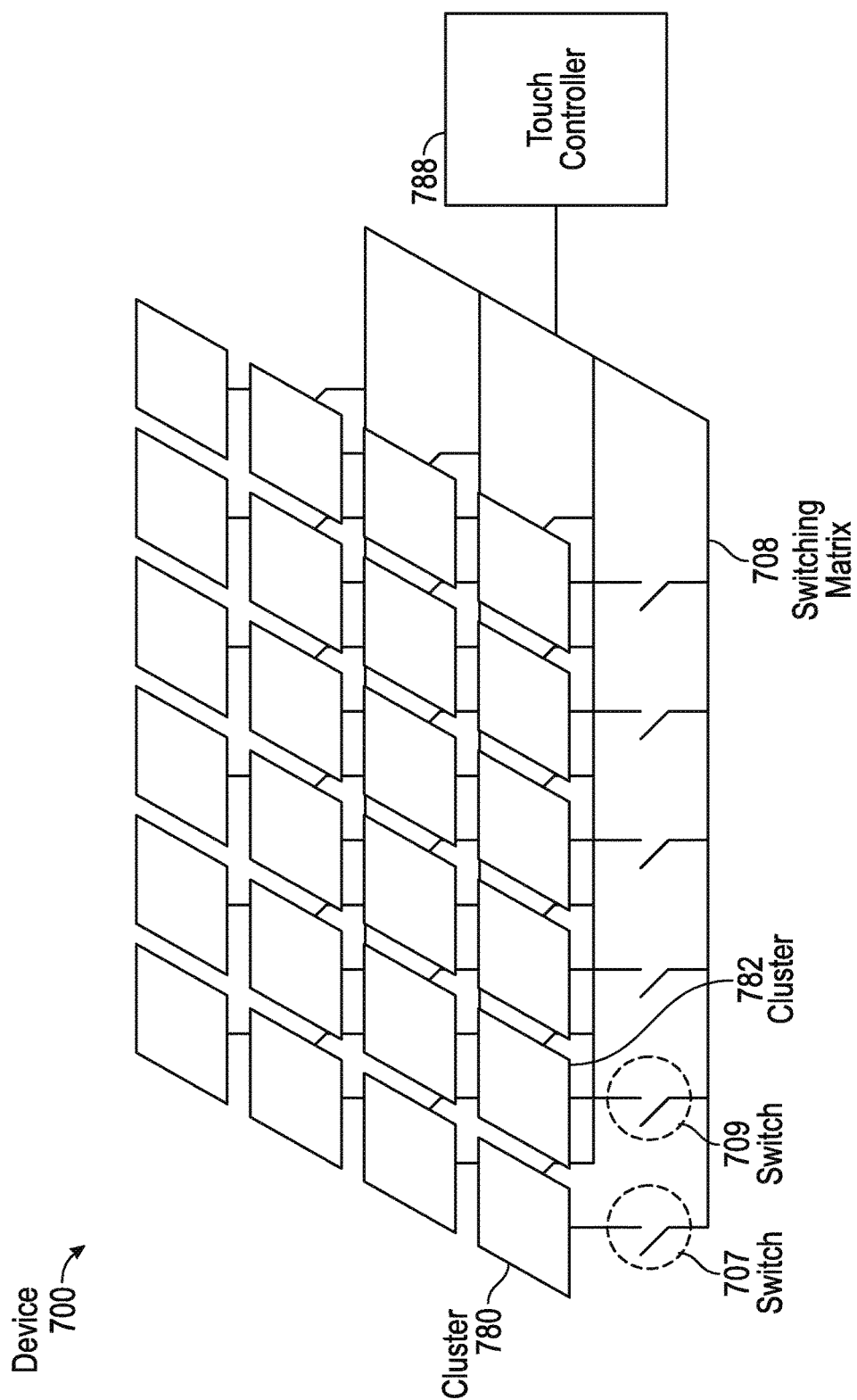
FIG. 7F illustrates an exemplary integrated Silicon-OLED display and touch sensor panel employing self-capacitive sensing according to examples of the disclosure.

In some examples, groups of clusters can be coupled together. FIG. 7F illustrates a plan view of an exemplary integrated Silicon-OLED display and touch sensor panel including a plurality of clusters coupled together. Device 700 can include a plurality of clusters such as cluster 780 and 782. Device 700 can include a switching matrix 708 coupled to the touch controller 788. One or more clusters can be coupled to a switch in the switching matrix 708. For example, cluster 780 can be coupled to switch 707, and cluster 782 can be coupled to switch 709. Cluster 780 and cluster 782 can be coupled together through switch 707 and switch 709. In some examples, device 700 can include fewer number of switches than clusters. In some examples, switches 707 and switch 709 can be directly connected to touch sensors within a cluster. In some examples, switches 707 and 709 can be included in the array of transistors (such as array of transistors 604 of FIGS. 6A-6D) and coupled to the touch sensors (such as touch plate 643 of FIGS. 6A-6D) and/or display subpixels (such as subpixels included in OLED stack 650 of FIGS. 6A-6D). In some examples, ESD device 605 can be replaced with switch 707, or switch 707 can be disposed next to ESD device 605.

By coupling multiple clusters together, the touch and/or display granularity or resolution can be dynamically changed and/or can be used to minimize power consumption through touch controller 788. The coupled clusters can be driven and sensed sequentially or concurrently. In some examples, the touch and/or display granularity can be dynamically changed across the entire area of the screen. In some examples, the touch and/or display granularity can be dynamically changed in some, but not all, portions of the screen. In some examples, touch and/or display granularity can be changed by coupling together, for example, every other row, every other column, every third row, and/or every third column. In some examples, touch and/or display granularity can be changed by coupling together rows, but not columns or vice versa. While FIG. 7E illustrates switch 707 located on a different layer than clusters 780 and 782, examples of the disclosure can include switches located on the same layer in a different area of the panel such as a border area. Examples of the disclosure can include switches, transistors, or wired connections.

Figure 8A:
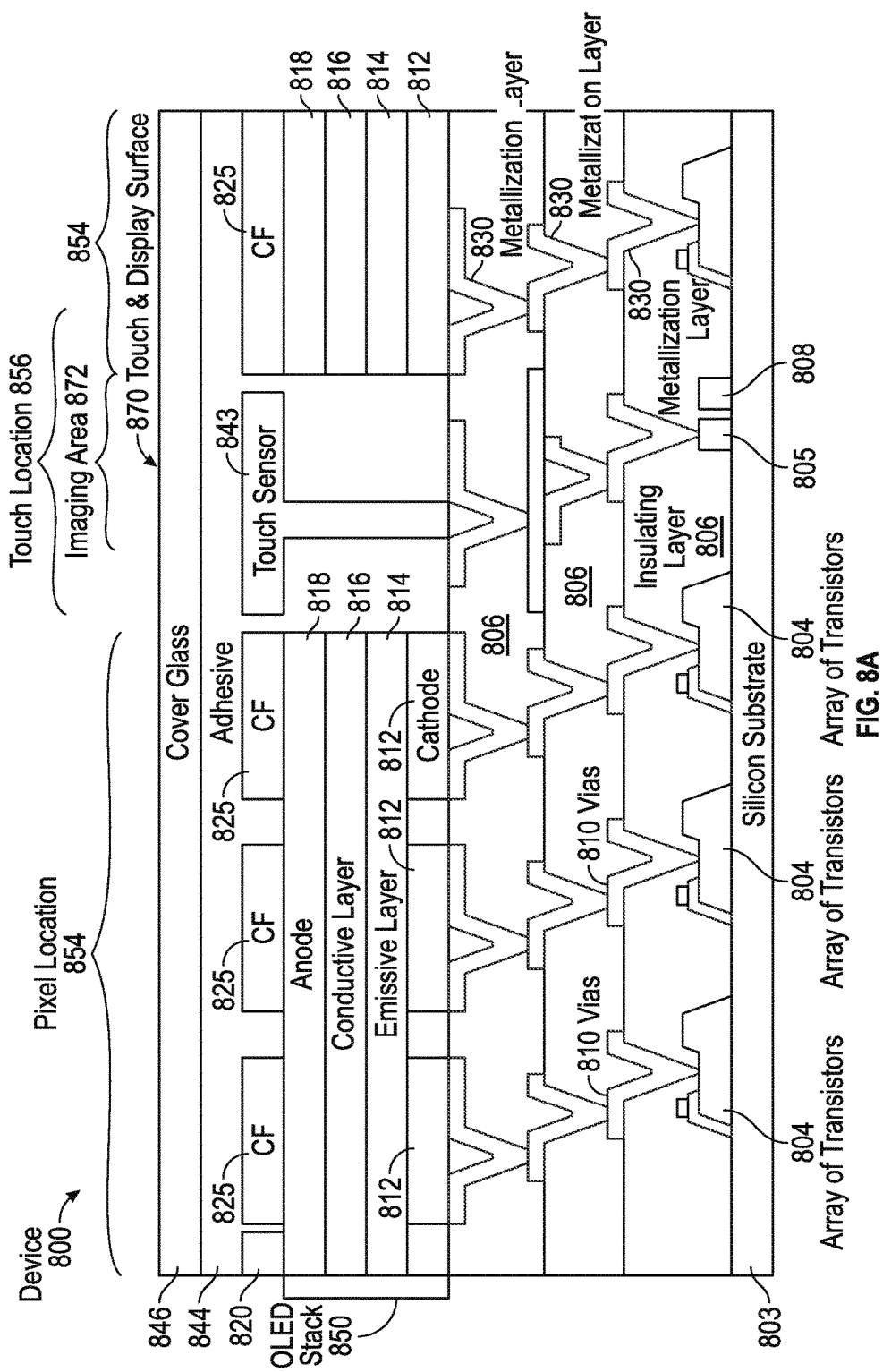
FIG. 8A illustrates a cross-sectional view of an exemplary integrated Silicon-OLED display and touch sensor panel including a photodiode according to examples of the disclosure.

The extremely high PPI can also allow the integrated Silicon-OLED display and touch sensor panel to accommodate for additional components and circuitry. FIG. 8A illustrates a cross-sectional view of an exemplary integrated Silicon-OLED display and touch sensor panel including a photodiode. Device 800 can include a Silicon substrate 803. An array of transistors 804 can be formed on substrate 803. The array of transistors 804 can be, for example, TFTs used to drive the subpixels to display an image and/or TFTs used to couple to the touch sensors for reduced granularity. Device 800 can also include one or more insulating layers 806, metallization layers 830, and vias 810 formed on substrate 803 for additional circuitry and/or connections to circuitry.

In a pixel location 854, cathode 812 can be formed on the one or more insulating layers 806, metallization layers 830, and vias 810. An emissive layer 814 can be applied or deposited on cathode 812. A conductive layer 816 can be disposed on emissive layer 814, and an anode 818 can be disposed on the conductive layer 816. Another metallization 820 can be disposed on anode 818 to couple anode 818 to power or ground. Color filters CF 825 can be disposed on anode 818 in the pixel location 854. In some examples, routing to the array of transistors 804 for the subpixels can be formed additionally or alternatively in the border areas of the device and/or between subpixels.

In a touch location 856, one or more touch sensors such as touch sensor 843 can be formed on the same layer as the color filters CF 825. In some examples, touch sensor 843 can be formed on the same layer as the color filters CF 825 near the touch and display surface 870. Touch sensor 843 can be routed to sensing circuitry using routing traces 841. In some examples, routing to touch sensor 843 can be formed on the same layer as any one of the metallization layers 830, insulating layers 806, or layers of the OLED stack 850. An ESD device 805 can be coupled to the touch sensor 843. In some examples, the ESD device 805 can be replaced with a switch. In some examples, device 800 can include both ESD device 805 and a switch. Device 800 can include a photodiode 808. Photodiode 808 can be used to capture an image located in or near imaging area 872. In some examples, photodiode 808 can be disposed near the ESD device 805 and/or switch. Photodiode 808 can be located on the same plane as any of the layers such as the same layer as the array of transistors 804. For enhanced touch sensitivity, some examples can include touch sensor 843 extended over the imaging area 872 of the photodiode 808. In some examples, photodiode 808 can be coupled to a switch and the resolution of an image captured by a plurality of photodiodes in device 800 can be dynamically changed.

Figures 8B, 8C:
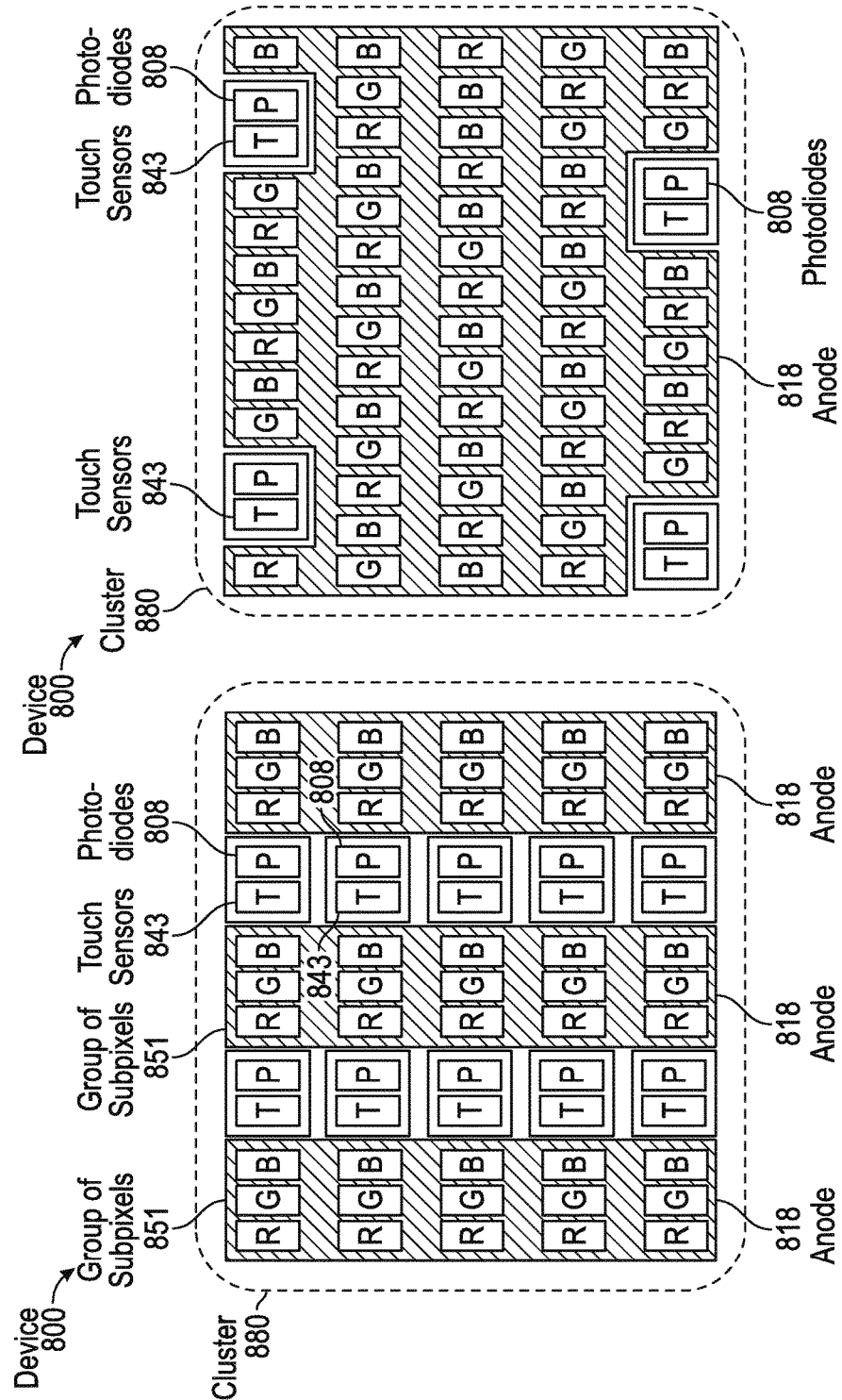
FIGS. 8B-8C illustrate top views of exemplary integrated Silicon-OLED display and touch sensor panels including photodiodes according to examples of the disclosure.

FIGS. 8B-8C illustrate a top view of an exemplary integrated Silicon-OLED display and touch sensor panel including photodiodes. Touch sensors 843 can be arranged next to or near photodiodes 808 to increase the sensing capacitance and enhance the touch sensitivity. Groups of subpixels 851, touch sensors 843, and photodiodes 808 can optionally be included in cluster 880. Anode 818 can be disposed in the pixel locations and can be coupled together (not shown) so that proper biasing can be applied from the edge of the display or from one or more underlying metallization layers. FIG. 8B illustrates an exemplary arrangement of red subpixels (referred to as "R"), green subpixels (referred to as "G"), blue subpixels (referred to as "B"), touch sensors (referred to as "T"), and photodiodes (referred to as "P") in a pattern of RGB-TP/RGB-TP. FIG. 8C illustrates an exemplary staggered arrangement. Other arrangements such as RGB-RTP/RGB-TPB can be used.

In some examples, photodiode 808 can be used for near-field imaging. The near-field imaging can be used for sensing touches detected through a user's glove or other barriers such as oils, gels, and moisture. Thereby, photodiode 808 can increase the sensing capability and enhanced touch sensitivity. In other examples, near-field imaging using photodiode 808 can be used for detecting a fingerprint image.

Figure 9A:
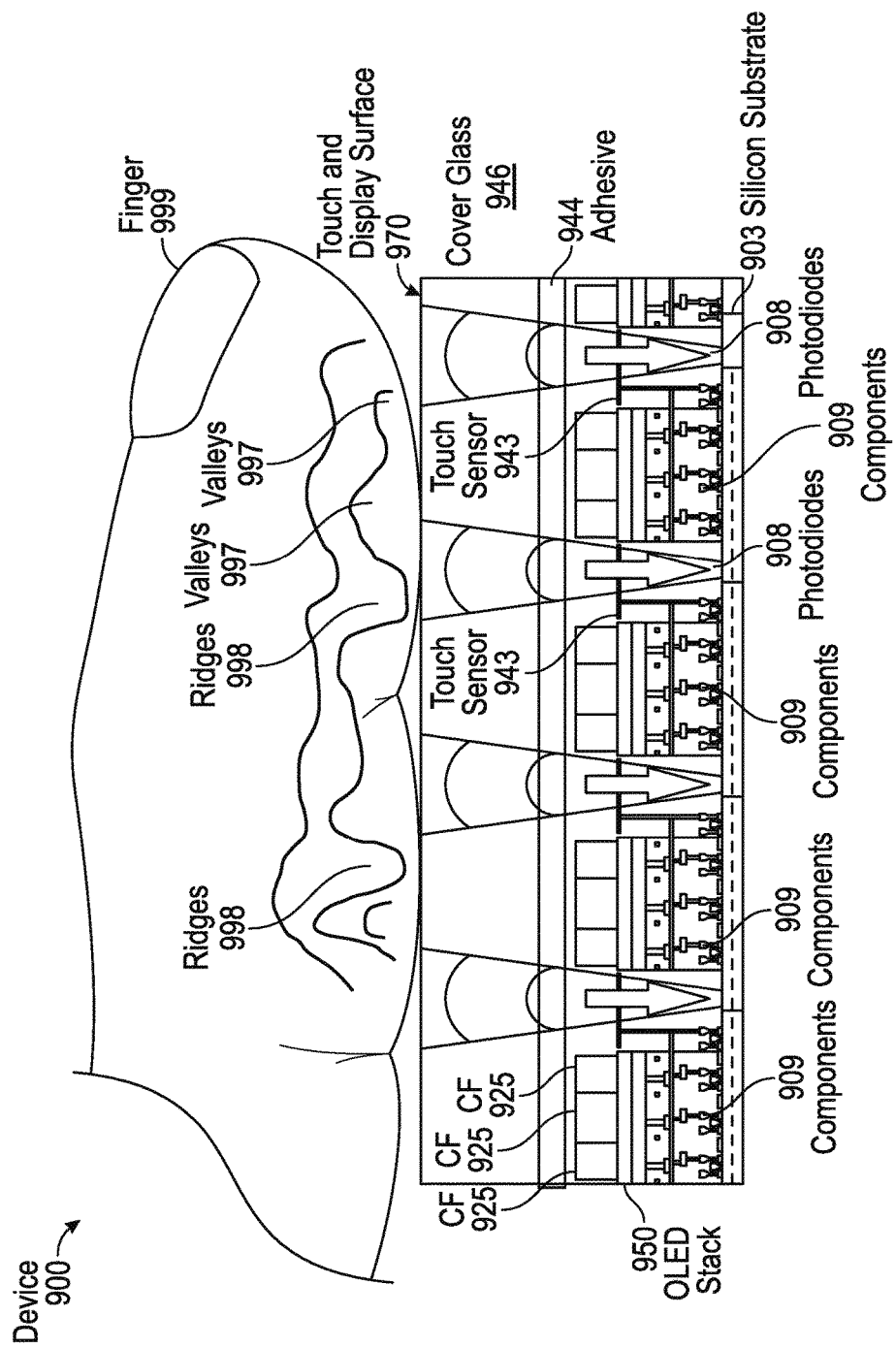
FIG. 9A illustrates a cross-sectional view of an exemplary integrated Silicon-OLED display and touch sensor panel with fingerprint detection according to examples of the disclosure.

FIG. 9A illustrates a cross-sectional view of an exemplary integrated Silicon-OLED display and touch sensor panel with fingerprint detection. Device 900 can include an OLED stack 950, components 909, color filters CF 925, photodiode 908, and touch sensors 943 disposed on Silicon substrate 903. Components 909 can include, but are not limited to, an array of transistors, vias, insulating layers, ESD devices, switches, and metallization layers. An object, such as finger 999, can touch or swipe the touch and display surface 970 of device 900. Photodiodes 908 can be used to detect a fingerprint image using near-field imaging. Near-field imaging allows for arbitrarily small details to be resolved, and can be well-suited for fingerprint detection. Photodiodes 908 can be any type of fingerprint reader such as, but not limited to, optical finger print readers or thermal finger print readers. Finger 999 can include ridges 998 and valleys 997 (areas between ridges 998), and photodiode 908 can use light to capture an image of the fingerprint. The ridges 998 of the finger can reflect more light, and the valleys 997 can reflect less light. In some examples, photodiodes 908 can use the difference in index of refraction or light reflection to differentiate between ridges 998 and valleys 997 (e.g., air). Photodiodes 908 can generate a black and white image of the fingerprint.

In some examples, device 900 can include discrete components for the OLED subpixels to display one or more images, touch sensors to sense a touch or hover, and photodiodes to capture a fingerprint image, thereby allowing the device to operate one or more of the three functionalities simultaneously. For example, the near-field imaging photodiode 908 can be used in conjunction with touch sensor 943. In some examples, photodiode 908 can be used to read a fingerprint image when a touch panel cannot use capacitive fingerprint sensing. For example, touch panels using pixelated self-capacitance may not have enough spatial resolution to read a fingerprint. In such an example, photodiode 908 can be placed near or next to the pixelated self-capacitance touch pads to allow the touch panel the capability to read both a fingerprint image and detect a touch activity while displaying an image using the OLED subpixels. In some examples, device 900 can include a plurality of photodiodes such as photodiode 908 configured for capturing an image or scanning a document.

Figure 9B:
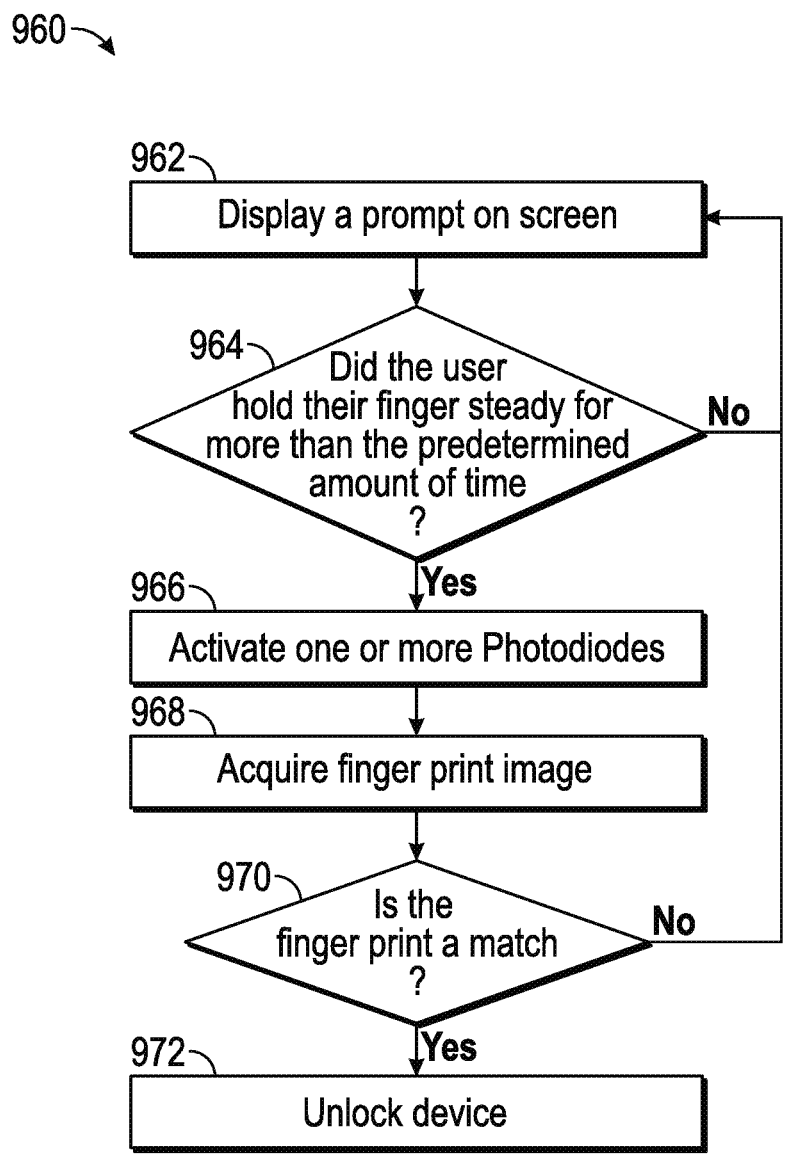
FIG. 9B illustrates a flowchart for a process of capturing a near-field image from photodiodes in an integrated Silicon-OLED display and touch sensor panel according to examples of the disclosure.

FIG. 9B illustrates an exemplary flowchart for capturing a near-field image from photodiodes in an integrated Silicon-OLED display and touch sensor panel according to examples of the disclosure. Flow 960 can begin with displaying a prompt on the screen through the display subpixels. The prompt can request the user to login by touching the screen or a button with their finger (block 962). The device can check that the user's finger is held steady and a touch is detected for more than a predetermined amount of time (block 964). After the check is successful, the device can activate one or more photodiodes (block 966). A fingerprint image can be acquired using the one or more photodiodes in block 968. The device can check if the fingerprint is a match (block 970). If the fingerprint image is a match, the device can unlock and allow the user access to the device (block 972). During one or more of the illustrated blocks, a fingerprint image can be detected by exclusively using the one or more activated photodiodes so the device can conserve power by deactivating the touch sensors. Additionally, the device can further conserve power by waiting until block 966 to activate or power on the photodiodes.

Figure 10A:
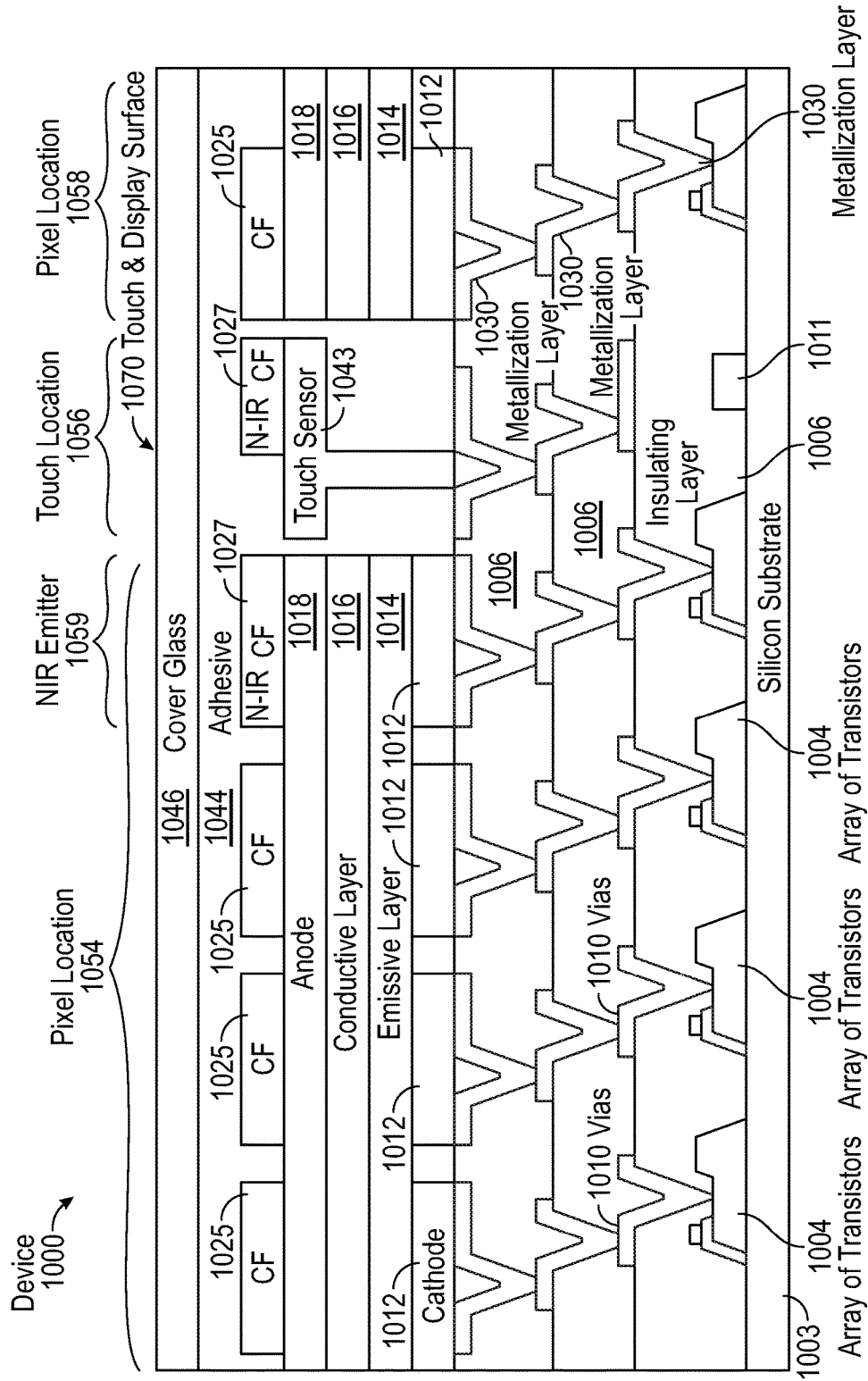
FIG. 10A illustrates a cross-sectional of an exemplary integrated Silicon-OLED display and touch sensor panel with a near-infrared detector according to examples of the disclosure.
Figure 10B:
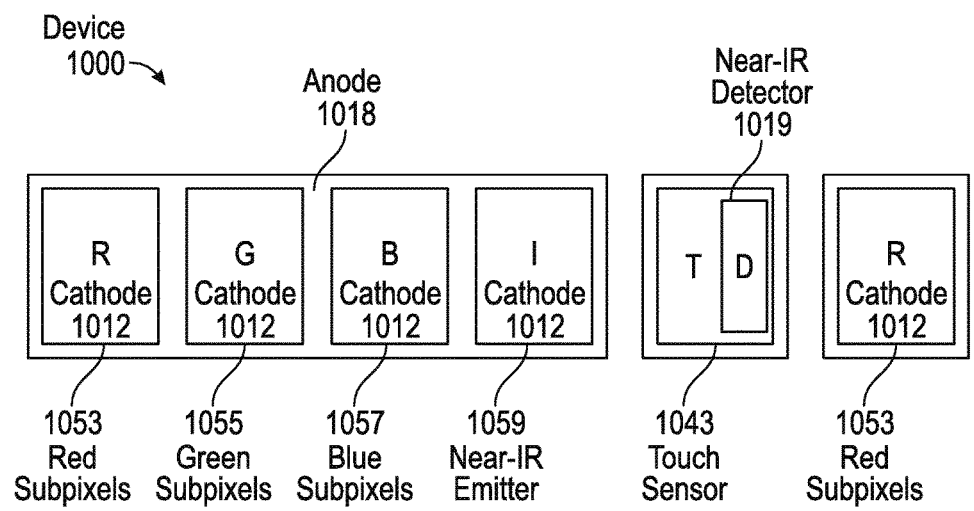
FIG. 10B illustrates a top view of an exemplary integrated Silicon-OLED display and touch sensor panel with a near-infrared detector according to examples of the disclosure.

In some examples, the photodiode can detect near-infrared wavelengths. FIG. 10A illustrates a cross-sectional and FIG. 10B illustrates a top view of an exemplary integrated Silicon-OLED display and touch sensor panel with a near-infrared detector. Device 1000 can include a Silicon substrate 1003. An array of transistors 1004 can be formed on substrate 1003. The array of transistors 1004 can be, for example, TFTs used to drive the subpixels to display an image or switches coupled to the touch sensors for changing the touch granularity. Device 1000 can also include one or more insulating layers 1006, metallization layers 1030, and vias 1010 formed on substrate 1003 for additional components 1009, circuitry and/or connections to other circuitry.

In a pixel location 1058, OLED stack 1050 can be formed to display images. OLED stack 1050 can include cathode 1012 formed on the one or more insulating layers 1006, metallization layers 1030, and vias 1010. An emissive layer 1014 can be deposited on cathode 1012, and a conductive layer 1016 can be disposed on emissive layer 1014. Anode 1018 can be disposed on conductive layer 1016, and a metallization (not shown) can be disposed on anode 1018. Metallization can be configured to couple anode 1018 to power or ground. One or more color filters CF 1025 can be disposed on anode 1018 to filter the appropriate color(s).

In a touch location 1056, one or more touch sensors such as touch sensor 1043 can be formed. Touch sensor 1043 can detect a touch or hover at the touch and display surface 1070. Touch sensor 1043 can be routed using routing traces in a border area or using routing traces in an underlying plane. Optionally, device 1000 can include an ESD device or switch.

Device 1000 can also include a near-infrared (NIR) detector 1011. The NIR detector 1011 can be configured for optically-assisted touch. Optically-assisted touch can improve the touch performance by measuring a user's touch or hover using the NIR detector 1011 in addition to using capacitive or resistive touch sensing with touch sensor 1043. Device 1000 can include a NIR color filter (NIR CF) 1027 disposed on the OLED stack 1050 in a location of a NIR emitter 1059 and NIR detector 1011.

FIG. 10B illustrates a top view of device 1000. A display pixel can include a red subpixel 1053 (referred to as "R"), a green subpixel 1055 (referred to as "G"), a blue subpixel 1057 (referred to as "B"), and near-IR emitter 1069 (referred to as "I"). Display subpixels can be located next to touch sensor 1043 (referred to as "T") and near-IR detector 1019.

Figure 10C:
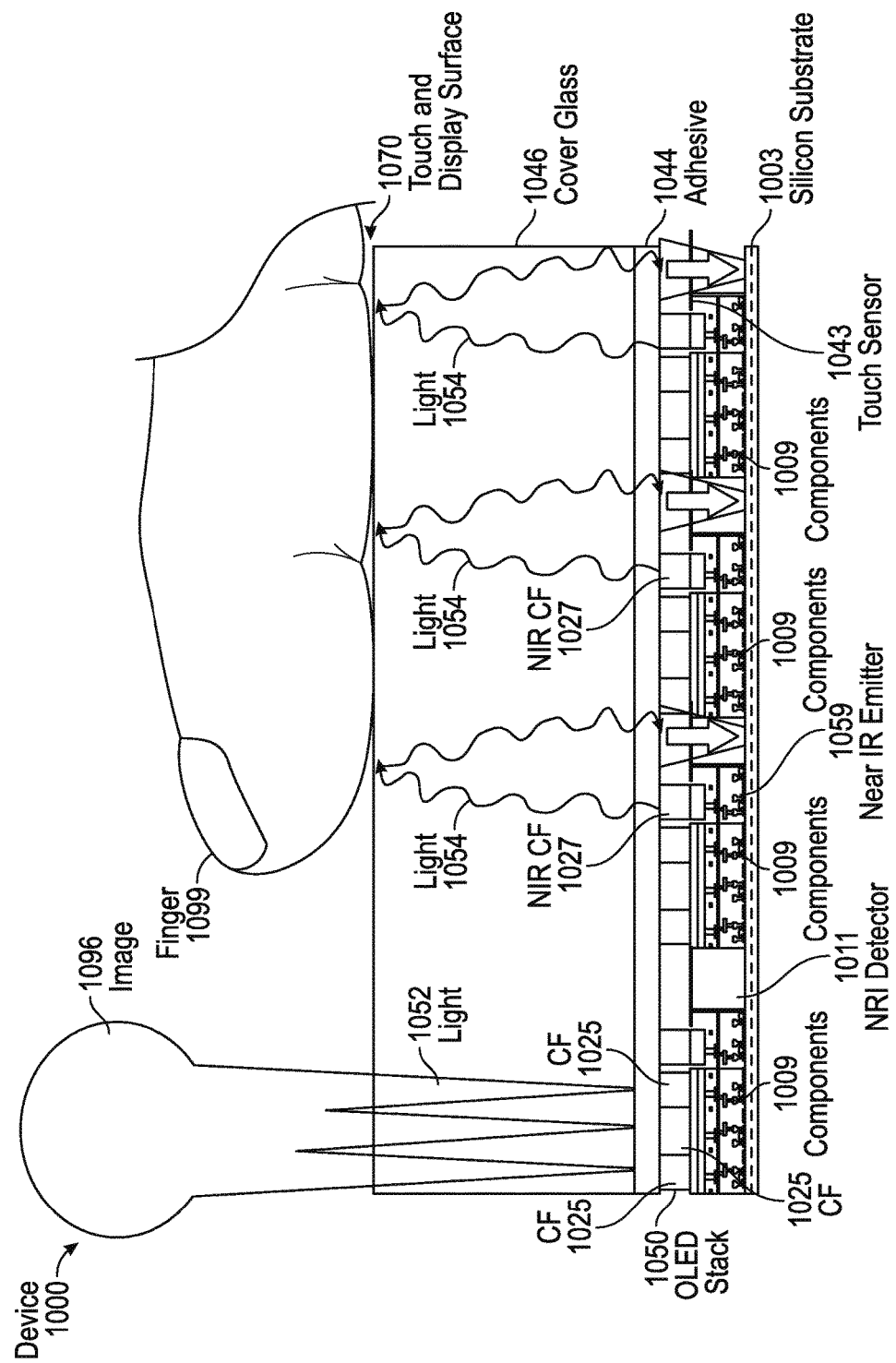
FIG. 10C illustrates a cross-sectional view of an exemplary integrated Silicon-OLED display and touch sensor panel with fingerprint detection using a near-infrared emitters and near-infrared detectors according to examples of the disclosure.

As illustrated in FIG. 10C, light 1052 can be light emitted from the OLED stack 1050 that propagated through CF 1025 and can be used to display an image 1096. Light 1054 from NIR emitter 1059 can be light emitted from the emissive layer (apart of the OLED stack 1050) that propagated through NIR CF 1027 and can be used for optically-assisted touch. NIR CF 1027 can filter out wavelengths of light outside the near-infrared wavelength range, and as a result, the user may not be able to visually see light 1054. When an object such as finger 1099 is touching or hovering over the touch and display surface 1070, light 1054 can reflect off the surface of finger 1099. The reflected light can pass through another NIR CF 1027 located above the NIR detector 1011 and can be detected using NIR detector 1011. In some examples, the NIR detector 1011 can be used to acquire a fingerprint image.

In some examples, the touch sensing capability of device 1000 can be optical only touch sensing. Device 1000 can use NIR detector 1011 and NIR CFs 1027 for optical only detection. Device 1000 can include a cover glass or cover material 1046 adhered to the OLED stack 1050 and touch sensors 1043 using adhesive 1044. Cover glass 1046 can act or can be configured to act as a light guide to enhance the performance and sensitivity of the optical touch sensing.

FIGS. 10D-10E illustrate a top view of an exemplary integrated Silicon-OLED display and touch sensor panel including near-field imaging photodiodes, NIR detectors, and NIR emitters. One or more touch sensors 1043 can be arranged next to or near photodiodes 1008. One or more additional touch sensors 1043 can be arranged next to or in close proximity to NIR detectors 1011. Groups of subpixels 1051 can include NIR emitters 1059. The groups of subpixels 1051, touch sensors 1043, photodiodes 1008, NIR detectors 1011, and NIR emitters 1059 can optionally be included in cluster 1080. Anode 1018 can be disposed in the pixel locations and can be coupled together so that proper biasing can be applied from the edge of the display or from one or more underlying metallization layers. FIG. 10D illustrates an exemplary arrangement of red subpixels (referred to as "R"), green subpixels (referred to as "G"), blue subpixels (referred to as "B"), NIR emitters (referred to as "I"), touch sensors (referred to as "T"), near-field imaging photodiodes (referred to as "P"), and near-IR detectors (referred to as "D") in a pattern of RGBI-TP/RGBI-TD. FIG. 10E illustrates an exemplary pattern with a staggered placement of groups of subpixels 1051 to prevent the touch sensors 1043, near-field imaging photodiodes 1008, and NIR detectors 1011 from forming a visually noticeable pattern.

One advantage to OLED displays can be the ability to be fabricated into curved display screens. One way to achieve curved display screens can be to form the OLED stack on a flexible substrate, such as plastic, metal, or flexible glass. However, forming the OLED stack on a flexible substrate can result in low PPI and problems associated with overlaying a touch sensor panel on a display can arise. To achieve a curved display screen without compromising a high PPI, one or more exemplary devices described above can be combined with a fiber optic magnifier.

Figure 11A:
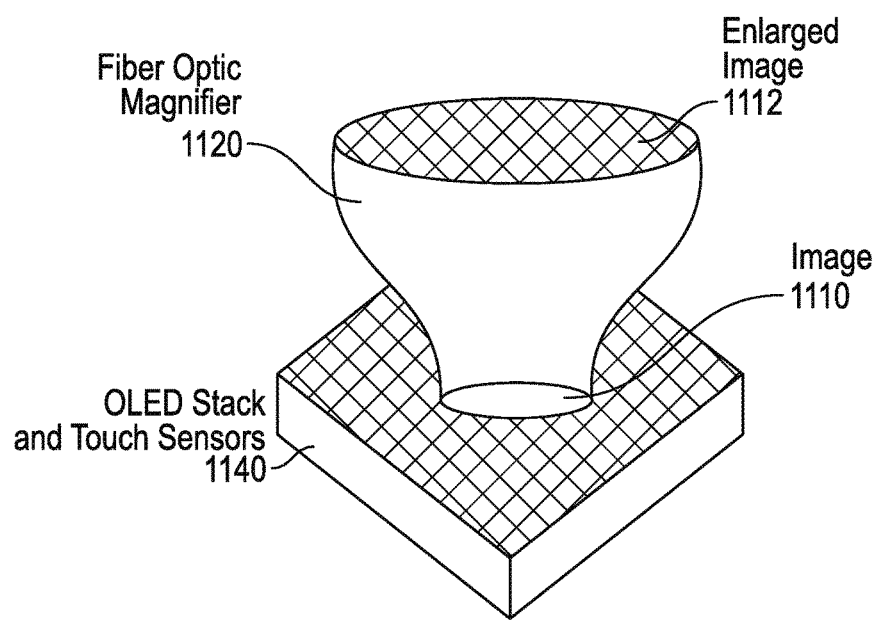
FIGS. 11A-11B illustrate cross-sectional views of exemplary integrated Silicon-OLED display and touch sensor panels coupled to fiber optic magnifiers according to examples of the disclosure.
Figure 11B:
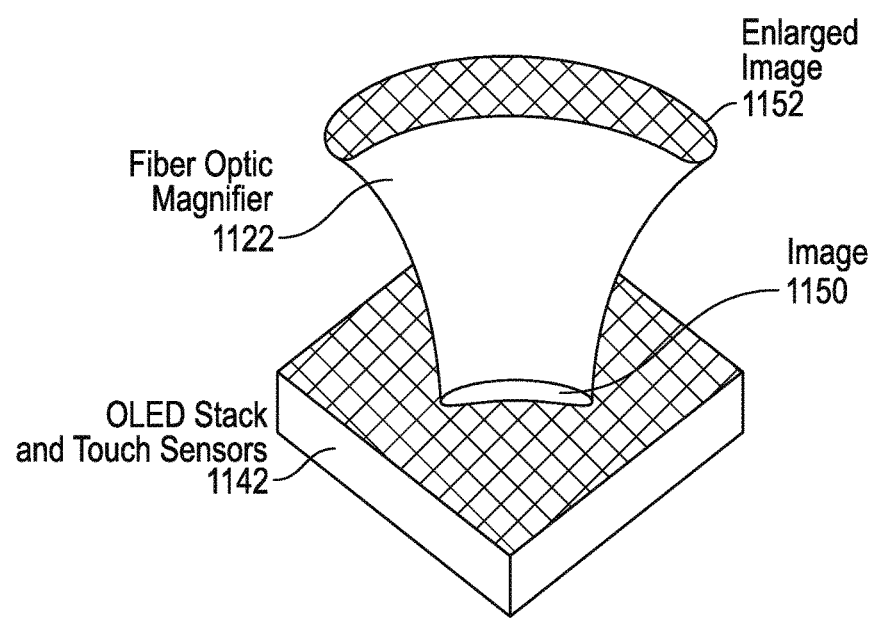

FIGS. 11A-11B illustrate cross-sectional views of exemplary integrated Silicon-OLED display and touch sensor panels coupled to fiber optic magnifiers. A fiber optic magnifier such as fiber optic magnifier 1120 and fiber optic magnifier 1122 can be a magnifier formed by juxtaposing thousands of fiber optic cables, melting the cables together, and pulling the melted cables to form a taper. The fiber optic magnifier coupled to a display screen can display an enlargement of the image projected by the display. Referring to FIG. 11A, OLED stack and touch sensors 1140 can display an image 1110. A fiber optic magnifier 1120 can be coupled to OLED stack and touch sensors 1140 to project an enlarged image 1112.

Different sizes and shapes of fiber optic magnifiers can be used. An exemplary integrated Silicon-OLED display and touch sensor panel coupled to a fiber optic magnifier is illustrated in FIG. 11B. OLED stack and touch sensors 1142 can display an image 1150. Fiber optic magnifier 1122 can be coupled to OLED stack and touch sensors 1142 to project an enlarged image 1152. Fiber optic magnifier 1122 of FIG. 11B can be formed with a larger curvature than fiber optic magnifier 1120 of FIG. 11A. Fiber optic magnifiers 1120 and 1122 can be used to form flat and curved displays.

Figure 11C:
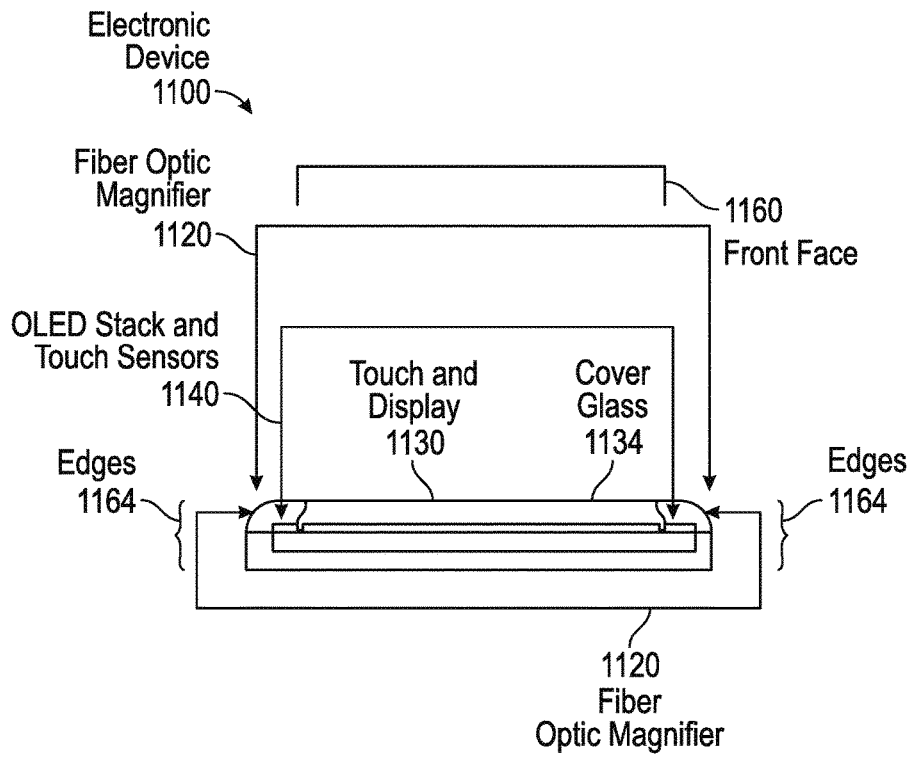
FIG. 11C illustrates a plan view of an exemplary integrated Silicon-OLED display and touch sensor panel with 180 degree display and touch capability according to examples of the disclosure.

FIG. 11C illustrates an exemplary integrated Silicon-OLED display and touch sensor panel with 180 degree display and touch capability. Electronic device 1100 can include a touch and display 1130 coupled with a cover glass 1134. An ordinary image can be projected on the front face of the device 1160. Device 1100 can include OLED stack and touch sensors 1140 located on the sides of the device. OLED stack and touch sensors 1140 can be coupled with fiber optic magnifier 1120 to form curved edges 1164. OLED stack and touch sensors 1140 can project an enlarged version of the ordinary image on the edges 1164. The combination of the touch and display 1130 coupled with cover glass 1134 and OLED stack and touch sensors 1140 coupled with fiber optic magnifiers 1120 can provide a device with curved surfaces and 180-degree display and touch capability.

Figure 11D:
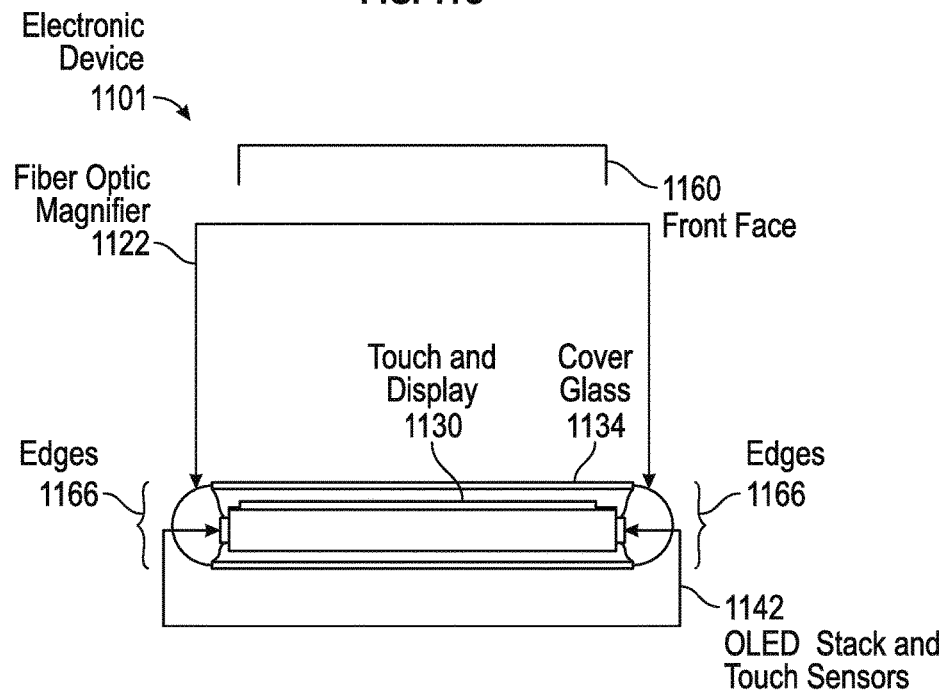
FIG. 11D illustrates a plan view of an exemplary integrated Silicon-OLED display and touch sensor panel with 270-degree display and touch capability according to examples of the disclosure.

FIG. 11D illustrates an exemplary integrated Silicon-OLED display and touch sensor panel with 270-degree display and touch capability. Electronic device 1101 can include a touch and display 1130 coupled with a cover glass 1134. An ordinary image can be projected on the front face 1160 of device 1101. Device 1101 can include OLED stack and touch sensors 1142 located on the sides of the device. OLED stack and touch sensors 1142 can be coupled with fiber optic magnifier 1122 to form curved edges 1166. OLED stack and touch sensors 1142 can project an enlarged version of the ordinary image on the sides of device 1101. The combination of the touch and display 1130 coupled with cover glass 1134 and OLED stack and touch sensors 1142 coupled with fiber optic magnifier 1122 can provide a device with curved surfaces and 270-degree display and touch capability.

In some examples, touch and display 1130 can be integrated touch and display. In some examples, touch and display 1130 can be coupled with a fiber optic magnifier such as fiber optic magnifier 1120 and 1122. In some examples, devices 1100 and 1101 can include any number of OLED stack and touch sensors 1140 and 1142 and fiber optic magnifiers 1120 or 1122. The location of the components is not limited to one on each side of the devices 1100 and 1101. In some examples, the taper of fiber optic magnifiers 1120 and 1122 can be varied to achieve any number of different degrees of display and touch capability. In some examples, devices 1100 and 1101 can include a display and cover glass or fiber optic magnifier on the back side (opposite side of front face 1160).

Figure 12:
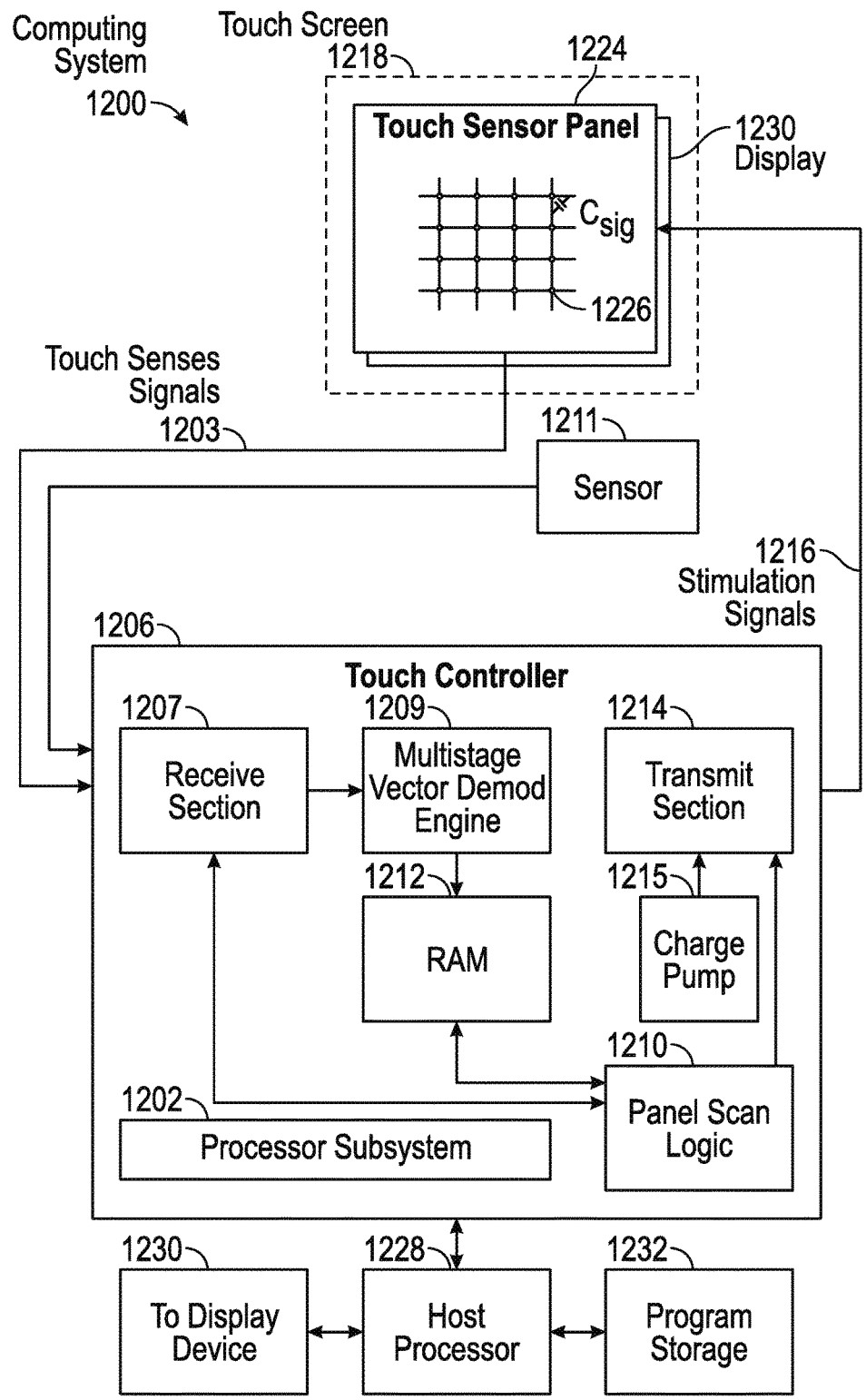
FIG. 12 illustrates an exemplary computing system for a touch sensor panel according to examples of the disclosure.

One further advantage to integrating the Silicon-OLED subpixels and touch sensors as described in the examples above is related to not only the thickness of the device stackup, but also the placement of components in the computing system and the total size of the device. FIG. 12 illustrates an exemplary computing system 1200 that can utilize a conventional touch sensor panel. Touch controller 1206 can be a single application specific integrated (ASIC) that can include one or more processor subsystems such as processor subsystem 1202. Processor subsystem 1202 can include, for example, one or more main processors, such as ARM968 processors or other processors with similar functionality and capabilities. However, in other examples, some of the processor functionality can be implemented instead by dedicated logic, such as a state machine. Processor subsystem 1202 can also include, for example, peripherals such as random access memory (RAM) 1212 or other types of memory or storage, watchdog timers (not shown), and the like. Touch controller 1206 can also include, for example, receive section 1207 for receiving signals, such as touch sense signals 1203, from the sense lines of touch sensor panel 1224, and other signals from other sensors such as sensor 1211, etc. Touch controller 1206 can also include, for example, a demodulation section such as multistage vector demod engine 1209, panel scan logic 1210, and a drive system including, for example, transmit section 1214. Panel scan logic 1210 can access RAM 1212, autonomously read data from the sense channels, and provide control for the sense channels. In addition, panel scan logic 1210 can control transmit section 1214 to generate stimulation signals 1216 at various frequencies and phases that can be selectively applied to the drive lines of the touch sensor panel 1224.

Charge pump 1215 can be used to generate the supply voltage for the transmit section. Stimulation signals 1216 (Vstim) can have amplitudes higher than the maximum voltage the ASIC process can tolerate by cascading transistors. Therefore, using charge pump 1215, the stimulus voltage can be higher (e.g., 6V) than the voltage level a single transistor can handle (e.g., 3.6 V). Although FIG. 12 shows charge pump 1215 separate from transmit section 1214, the charge pump can be part of the transmit section.

Touch sensor panel 1224 can include a capacitive sensing medium having a plurality of drive lines and a plurality of sense lines. The drive and sense lines can be formed from a transparent conductive medium such as ITO or Antimony Tin Oxide (ATO), although other transparent and non-transparent materials such as copper can also be used. Drive and sense lines can be perpendicular to each other, although other non-Cartesian orientations are possible. For example, in a polar coordinate system, the sensing lines can be concentric circles and the driving lines can be radially extending lines (or vice versa). It should be understood, therefore, that the terms "drive lines" and "sense lines" as used herein are intended to encompass not only orthogonal grids, but the intersecting traces or other geometric configurations having first and second dimensions (e.g. the concentric and radial lines of a polar-coordinate arrangement). The drive and sense lines can be formed on, for example, a single side of a substantially transparent substrate.

At the "intersections" of the traces, where the drive and sense lines can pass adjacent to and above and below (cross) each other (but without making direct electrical contact with each other), the drive and sense lines can essentially form two electrodes (although more than two traces could intersect as well). Each intersection of drive and sense lines can represent a capacitive sensing node and can be viewed as pixel or node 1226, which can be particularly useful when touch sensor panel 1224 can be viewed as capturing an "image" of touch. In other words, after touch controller 1206 has determined whether a touch event has been detected at each touch sensor in the touch sensor panel, the pattern of touch sensors in the multi-touch panel at which a touch event occurred can be viewed as an "image" of touch (e.g., a pattern of fingers touching the panel). The capacitance between drive and sense electrodes can appear as a stray capacitance when the given row is held at direct current (DC) voltage levels and as a mutual signal capacitance Csig when the given row is stimulated with an alternating current (AC) signal. The presence of a finger or other object near or on the touch sensor panel can be detected by measuring changes to a signal charge Qsig present at the pixels being touched, which can be a function of Csig.

Computing system 1200 can also include host processor 1228 for receiving outputs from processor subsystem 1202 and performing actions based on the outputs that can include, but are not limited to, moving an object such as a cursor or pointer, scrolling or panning, adjusting control settings, opening a file or document, viewing a menu, making a selection, executing instructions, operating a peripheral device coupled to the host device, answering a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 1228 can perform additional functions that may not be related to panel processing, and can be coupled to program storage 1232 and display 1230, such as an LCD display or OLED display on a glass or plastic substrate, for providing a user interface to a user for the device. In some examples, host processor 1228 can be a separate component for touch controller 1206, as shown. In other examples, host processor 1228 can be included as part of touch controller 1206. In other examples, the functions of host processor 1228 can be performed by processor subsystem 1202 and/or distributed among other components of touch controller 1206. Display device 1230 together with touch sensor panel 1224, when located partially or entirely under the touch sensor panel, can form touch screen 1218.

Figure 13:
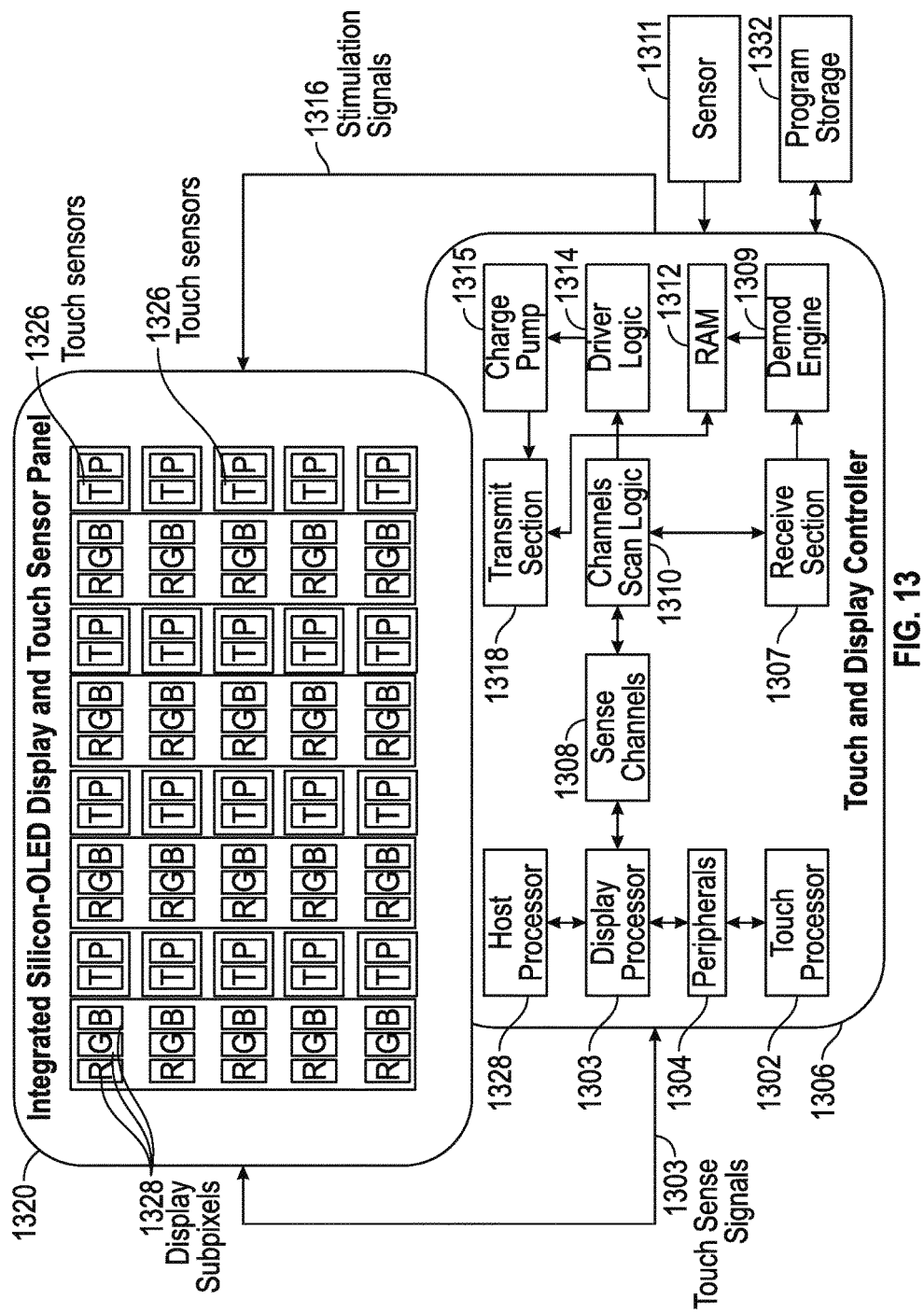
FIG. 13 illustrates an exemplary computing system for an integrated Silicon-OLED display and touch sensor panel according to examples of the disclosure.

FIG. 13 illustrates an exemplary computing system 1300 that can utilize the integrated Silicon-OLED display and touch sensor panel discussed above according to various examples of the disclosure. Computing system can be included in, for example, mobile telephone 136, digital media player 140, tablet computing device 148, or any mobile or non-mobile computing device that includes touch and display screen 120. Due to the high PPI achieved by forming the OLED subpixels on a Silicon substrate, touch sensors 1326 and OLED display subpixels 1328 can be integrated and formed side-by-side on the same substrate. Touch and display controller 1306 can also be formed on a Silicon substrate using processes similar to the above described processes, and can be integrated with the touch sensors 1326 and OLED display subpixels 1328.

Computing system 1300 can include a touch and display controller 1306. Touch and display controller 1306 can include one or more touch processors 1302, one or more display processors 1303, and peripherals 1304. Peripherals 1304 can include, but are not limited to, RAM or other types of memory or non-transitory computer-readable storage media capable of storing program instructions executing by the touch processors 1302, display processors 1303 watchdog timers, and the like. Touch and display controller 1306 can include, but is not limited to one or more sense channels 1308, channel scan logic 1310 and driver logic 1314. Channel scan logic 1310 can access RAM 1312, autonomously read data from the sense channels and provide control for the sense channels. In addition, channel scan logic 1310 can control driver logic 1314 to generate stimulation signals 1316 at various frequencies and phases that can be selectively applied to drive regions or sensing electrodes of the touch sensing circuitry of integrated Silicon-OLED display and touch screen 1320. In some examples, touch and display controller 1306, touch processor 1302, display processor 1303, and peripherals 1304 can be integrated into a single application specific integrated circuit (ASIC). A processor, such as touch processor 1302, executing instructions stored in non-transitory computer-readable storage media found in peripherals 1304 or RAM 1312, can control touch sensing and processor, for example.

Touch and display controller 1306 can also include a host processor 1328 for receiving outputs from touch processor 1302 and display processor 1303 and performing actions based on the outputs. For example, host processor 1328 can be coupled to program storage 1332 and display processor 1303. Host processor 1328 can use display processor 1303 to generate an image on the integrated Silicon-OLED display and touch screen 1320, such as an image of a user interface (UI), by executing instructions stored in non-transitory computer-readable storage media found in program storage 1332, for example, by applying the appropriate voltages to the cathode and anodes of the OLED stack. In some examples, touch processor 1302, touch and display controller 1306, display processor 1303, and host processor 1308 can operate independently or cooperatively together. Host processor 1328 can use touch processor 1302 and display processor 1303 to detect and process a touch on or near the integrated Silicon-OLED display and touch sensor panel 1320, such as a touch input to the displayed UI (displayed by display subpixels 1328). The touch input can be used by computer programs stored in program storage 1332 to perform actions. Host processor 1328 can perform additional functions that may or may not be related to touch and display processing. In some examples, host processor 1328 can be included as part of touch and display controller 1306, as shown. In some examples, host processor 1328 can be a separate component for touch and display controller 1306. In some examples, the functions of host processor 1328 can be performed by processor subsystem 1302 and/or distributed among other components of touch and display controller 1306.

Similar to touch controller 1206 of exemplary computing system 1200, touch and display controller 1306 can also include, for example, receive section 1307 for receiving signals, such as touch sense signals 1303 from touch sensors 1326, and other signals from other sensors such as sensor 1311, etc. Touch and display controller 1306 can also include, for example, a demodulation section such as demod engine 1309 and a drive system including, for example, transmit section 1318. Channel scan logic 1310 can access RAM 1312, autonomously read data from the sense channels 1308, and provide control for the sense channels 1308. In addition, channel scan logic 1310 can control transmit section 1318 to generate stimulation signals 1316 at various frequencies and phases that can be selectively applied to the drive lines or sensing electrodes of the integrated Silicon-OLED display and touch sensor panel 1320.

The integrated Silicon-OLED display and touch sensor panel 1320 can be formed from the stackup configurations discussed above, and can include a capacitive sensing medium having a plurality of touch sensors such as touch plates, touch sensor layers, or touch electrodes. Some of the touch sensors can form drive regions, and some of the touch sensors can form sense regions. The touch sensors can be formed from a transparent conductive medium such as ITO or ATO, although other transparent and non-transparent materials such as copper can also be used. In some examples, the drive regions and sense regions can be drive and sense lines perpendicular to each other. Although in other examples, other non-Cartesian orientations are possible. For example, in a polar coordinate system, the sensing lines can be concentric circles and the driving lines can be radially extending lines (or vice versa). The touch sensors can be formed on, for example, a single side of a substrate, both sides of a substrate, or on different substrates.

Note that one or more of the functions described above can be performed, for example, by firmware stored in memory (e.g., one of the peripherals) and executed by processor subsystem, or stored in program storage 1332 and executed by host processor 1328. The firmware can also be stored and/or transported within any non-transitory computer-readable storage medium (excluding signals) for use by or in connection with an instruction execution system, apparatus, or device, such as a computer-based system, processor-containing system, or other system that can fetch instructions from the instruction execution system, apparatus, or device and execute the instructions. In the context of this document, a "non-transitory computer-readable storage medium" can be any medium (excluding a signal) that can contain or store the program for use by or in connection with the instruction execution system, apparatus, or device. The non-transitory computer readable storage medium can include, but is not limited to, an electronic, magnetic, optical, electromagnetic, infrared, or semiconductor system, apparatus, or device, a portable computer diskette (magnetic), a random access memory (RAM)(magnetic), a read-only memory (ROM)(magnetic), an erasable programmable read-only memory (EPROM)(magnetic), a portable optical disk such as CD, CD-R, CD-RW, DVD, DVD-R, or DVD-RW, or flash memory such as compact flash cards, secured digital cards, USB memory devices, memory sticks and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this disclosure, a "transport medium" can be any medium that can communicate, propagate, or transport the program for use by or in connection with the instruction execution system, apparatus, or device. The transport readable medium can include, but is not limited to, an electronic, magnetic, optical, electromagnetic, or infrared wired or wireless propagation medium.

In some examples, a touch sensor panel is disclosed. The touch sensor panel may comprise: one or more Silicon substrates; an OLED stack formed on at least one of the one or more Silicon substrates; and a plurality of touch sensors formed on at least one of the one or more Silicon substrates. Additionally or alternatively to one or more examples disclosed above, in other examples the OLED stack and plurality of touch sensors are disposed side by side. Additionally or alternatively to one or more examples disclosed above, in other examples at least one of the plurality of touch sensors is located on a same layer as an anode of the OLED stack. Additionally or alternatively to one or more examples disclosed above, in other examples the touch sensor panel further comprises one or more color filters, wherein at least one of the plurality of touch sensors are located on a same layer as at least one color filter. Additionally or alternatively to one or more examples disclosed above, in other examples the touch sensor panel further comprises one or more transistors, wherein the one or more transistors form a transistor driver structure for the OLED stack. Additionally or alternatively to one or more examples disclosed above, in other examples the touch sensor panel further comprises a transistor, wherein the transistor is coupled to at least one of the plurality of touch sensors. Additionally or alternatively to one or more examples disclosed above, in other examples the OLED stack is located in a pixel location and the plurality of touch sensors are located in a touch location, the pixel location distinct from the touch location. Additionally or alternatively to one or more examples disclosed above, in other examples the touch sensor panel further comprises an electrostatic discharge device. Additionally or alternatively to one or more examples disclosed above, in other examples at least one of the plurality of touch sensors includes a touch sensor layer, the touch sensor layer disposed on the OLED stack. Additionally or alternatively to one or more examples disclosed above, in other examples an area of the touch sensor layer is the same as an area of a display pixel of the OLED stack. Additionally or alternatively to one or more examples disclosed above, in other examples the touch sensor panel further comprises a light shielding, wherein the light shielding is configured to sense a touch. Additionally or alternatively to one or more examples disclosed above, in other examples the light shielding is a multi-layer thin film stack. Additionally or alternatively to one or more examples disclosed above, in other examples one or more subpixels of the OLED stack and one or more touch sensors are included in one of a plurality of clusters. Additionally or alternatively to one or more examples disclosed above, in other examples the touch sensor panel further comprises a switching matrix, wherein at least one of the plurality of clusters is coupled to a switch in the switching matrix. Additionally or alternatively to one or more examples disclosed above, in other examples at least one of a display granularity and touch granularity is dynamically changed through the switching matrix. Additionally or alternatively to one or more examples disclosed above, in other examples the touch sensor panel further comprises: one or more photodiodes. Additionally or alternatively to one or more examples disclosed above, in other examples at least one of the one or more photodiodes is configured for near-field imaging. Additionally or alternatively to one or more examples disclosed above, in other examples at least one of the one or more photodiodes is configured to detect a fingerprint. Additionally or alternatively to one or more examples disclosed above, in other examples the touch sensor panel is configured to display an image on the OLED stack, sense a touch or hover on the touch sensors, and capture an image from the one or more photodiodes at a same time. Additionally or alternatively to one or more examples disclosed above, in other examples at least one of the one or more photodiodes is a near-infrared detector. Additionally or alternatively to one or more examples disclosed above, in other examples the near-infrared detector is coupled to a near-infrared emitter. Additionally or alternatively to one or more examples disclosed above, in other examples the touch sensor panel further comprises a near-infrared color filter, wherein the near-infrared emitter is included in the OLED stack.

In some examples, a method of forming a touch sensor panel is disclosed. The method may comprise: forming an OLED stack on at least one of one or more Silicon substrates; and forming a plurality of touch sensors on at least one of the one or more Silicon substrates. Additionally or alternatively to one or more examples disclosed above, in other examples the method further comprises: forming an electrostatic discharge device. Additionally or alternatively to one or more examples disclosed above, in other examples the method further comprises: forming one or more photodiodes.

Although the disclosed examples have been fully described with reference to the accompanying drawings, it is to be noted that various changes and modifications will become apparent to those skilled in the art. Such changes and modifications are to be understood as being included within the scope of the disclosed examples as defined by the appended claims.

What is claimed is:

1. A touch sensor panel, comprising:
   one or more Silicon substrates;
   a plurality of display pixels, each display pixel including a plurality of subpixels formed by an OLED stack on at least one of the one or more Silicon substrates, the plurality of subpixels configured to emit light; and
   a plurality of touch sensors including:
      a plurality of first touch sensors formed from first touch electrodes having a first width on the at least one of the one or more Silicon substrates in between subpixels within a same display pixel, the plurality of first touch sensors being multi-functional components capable of detecting touch using the first touch electrodes and configured for shielding at least a portion of the emitted light from the plurality of subpixels; and
      a plurality of second touch sensors formed from second touch electrodes having a second width on the at least one of the one or more Silicon substrates in between adjacent display pixels, the plurality of second touch sensors being capable of detecting touch using the second touch electrodes, wherein the second width is greater than the first width, and the plurality of subpixels and the plurality of second touch sensors are arranged in a pattern of rows and columns, wherein the plurality of second touch sensors are arranged as a plurality of rows along a first axis, wherein all of the second touch sensors of a row have different locations along a second axis than all of the touch sensors of an adjacent row, the second axis orthogonal to the first axis.

2. The touch sensor panel of claim 1, further comprising:
   a plurality of routing traces located on a same layer as the plurality of touch sensors and the plurality of subpixels and between two or more of the plurality of subpixels.

3. The touch sensor panel of claim 1, further comprising: an electrostatic discharge device coupled to at least one of the plurality of touch sensors and located between the plurality of touch sensors and the one or more Silicon substrates.

4. The touch sensor panel of claim 1, wherein an area of at least one of the plurality of second touch sensors is same as an area of at least one of the plurality of subpixels.

5. The touch sensor panel of claim 1, further comprising: one or more photodiodes configured to detect an optical image of a fingerprint.

6. The touch sensor panel of claim 1, further comprising:
   a near-infrared emitter configured to emit near-infrared light towards a touch object; and
   a near-infrared detector configured to detect a reflection of the emitted near-infrared light to sense a touch associated with the touch object.

7. The touch sensor panel of claim 1, further comprising: a black mask located in a peripheral area of the touch sensor panel, the black mask formed of a same material as the plurality of touch sensors.

8. The touch sensor panel of claim 1, further comprising: a curved fiber optic magnifier coupled to the OLED stack and the plurality of touch sensors, wherein the one or more Silicon substrates are flexible substrates.

9. The touch sensor panel of claim 1, wherein the plurality of touch sensors are opaque.

10. The touch sensor panel of claim 1, wherein light shielding includes preventing color mixing of two or more of the plurality of subpixels.

11. The touch sensor panel of claim 1, further comprising:
    a cover material, wherein the plurality of touch sensors are located between the plurality of subpixels and the cover material.

12. The touch sensor panel of claim 1, wherein the first and second touch electrodes are located in a single layer.

13. The touch sensor panel of claim 1, further comprising one or more color filters, wherein at least one of the plurality of touch sensors is located on a same layer as at least one of the one or more color filters.

14. The touch sensor panel of claim 13, wherein each of the plurality of first touch sensors is located between two color filters.

15. The touch sensor panel of claim 1, further comprising:
    a plurality of clusters, each cluster including a set of the plurality of touch sensors electrically coupled together;
    a plurality of switches, each switch coupled to one of the plurality of clusters; and
    a switching matrix configured to dynamically change a touch granularity by coupling or decoupling each cluster to a touch controller.

16. The touch sensor panel of claim 15, wherein a number of switches included in the plurality of switches is less than a number of clusters included in the plurality of clusters.

17. A method of detecting a touch using a touch sensor panel, the method comprising:
    displaying an image using a plurality of display pixels, each display pixel including a plurality of subpixels formed by an OLED stack formed on at least one of one or more Silicon substrates, the OLED stack configured to emit light;
    detecting one or more touches using a plurality of first touch electrodes having a first width, the plurality of first touch electrodes included in a plurality of first touch sensors, the plurality of first touch sensors located on the at least one of the one or more Silicon substrates and in between subpixels within a same display pixel;
    detecting the one or more touches using a plurality of second touch electrodes having a second width, the second touch electrodes included in a plurality of second touch sensors, the plurality of second touch sensors located on the at least one of the one or more Silicon substrates and in between adjacent display pixels, wherein the second width is greater than the first width, and the plurality of subpixels and the plurality of second touch sensors are arranged in a pattern of rows and columns, wherein the plurality of second touch sensors are arranged as a plurality of rows along a first axis, wherein all of the second touch sensors of a row have different locations along a second axis than all of the touch sensors of an adjacent row, the second axis orthogonal to the first axis; and
    shielding at least a portion of the light emitted from the OLED stack using the plurality of first touch electrodes.

18. The method of claim 17, further comprising:
    dynamically changing a touch granularity by coupling or decoupling a plurality of clusters to a touch controller, wherein each cluster includes a plurality of touch sensors electrically coupled together, the plurality of touch sensors electrically coupled together including one or more of one or more of the plurality of first touch sensors and one or more of the plurality of second touch sensors.

19. The method of claim 17, wherein detecting the one or more touches using one or more of the plurality of first touch sensors and the plurality of second touch sensors includes driving the one or more of the plurality of first touch sensors and the plurality of second touch sensors simultaneously with driving the plurality of subpixels.

20. The method of claim 17, further comprising:
emitting near-infrared light;
detecting a reflection of the near-infrared light; and
determining the first or second touch based on the detected reflection and a capacitance or resistance detected by the plurality of first or second touch sensors.

21. The method of claim 17, further comprising:
in an idle state:
deactivating the plurality of first touch sensors and the plurality of second touch sensors;
activating one or more photodiodes to detect reflection of a fingerprint;
determining if the detected reflection matches a pre-determined image; and
unlocking the touch sensor panel when the detected reflection matches the pre-determined image,
wherein detecting the first touch using the plurality of first touch sensors and detecting the second touch using the plurality of second touch sensors are included in an active state.

22. The method of claim 17, wherein:
detecting the one or more touches using the plurality of first touch electrodes includes detecting a first touch of the one or more touches, and
detecting the one or more touches using the plurality of second touch electrodes includes detecting a second touch of the one or more touches different from the first touch.

23. The method of claim 17, further comprising:
detecting an optical image of a fingerprint using one or more photodiodes.

24. The method of claim 23, wherein displaying the image using the OLED stack includes driving the plurality of subpixels, wherein detecting the first touch using the plurality of first touch sensors includes driving the plurality of first touch sensors, wherein detecting the second touch using the plurality of second touch sensors includes driving the plurality of second touch sensors, and further wherein detecting the optical image of the fingerprint includes activating and driving the one or more photodiodes, the plurality of subpixels, the plurality of first touch sensors, the plurality of second touch sensors, and the one or more photodiodes simultaneously.

25. The method of claim 23, wherein detecting the optical image of the fingerprint includes:
determining a difference of at least one of refractive indices and light reflections at two or more locations of the fingerprint; and
generating the optical image of the fingerprint based on the difference.

* * * * *